(12) United States Patent
Hayashi et al.

(10) Patent No.: US 7,469,396 B2
(45) Date of Patent: Dec. 23, 2008

(54) SEMICONDUCTOR DEVICE AND LAYOUT DESIGN METHOD THEREFOR

(75) Inventors: Kohtaro Hayashi, Kyoto (JP); Akinori Shibayama, Kyoto (JP)

(73) Assignee: Panasonic Corporation, Osaka (JP)

( * ) Notice: Subject to any disclaimer, the term of this patent is extended or adjusted under 35 U.S.C. 154(b) by 400 days.

(21) Appl. No.: 11/149,350

(22) Filed: Jun. 10, 2005

(65) Prior Publication Data

US 2005/0274983 A1 Dec. 15, 2005

(30) Foreign Application Priority Data

Jun. 11, 2004 (JP) ............. P. 2004-174329

(51) Int. Cl.
*G06F 17/50* (2006.01)
(52) U.S. Cl. ............ 716/8; 716/9; 716/10; 716/11; 716/12
(58) Field of Classification Search ........ 716/8–13; 257/206, 213, 296, 330, 752, 758, 766; 438/281, 438/283, 400
See application file for complete search history.

(56) References Cited

U.S. PATENT DOCUMENTS

| | | | |
|---|---|---|---|
| 5,789,776 A * | 8/1998 | Lancaster et al. | 257/296 |
| 5,847,421 A | 12/1998 | Yamaguchi | |
| 6,084,256 A | 7/2000 | Nakata | |
| 6,121,093 A | 9/2000 | Cheng et al. | |
| 6,194,252 B1 | 2/2001 | Yamaguchi | |
| 6,396,123 B1 | 5/2002 | Nagaoka | |
| 6,635,935 B2 | 10/2003 | Makino | |
| 6,639,282 B2 | 10/2003 | Lee et al. | |
| 6,707,089 B2 | 3/2004 | Kim et al. | |
| 2005/0161735 A1 * | 7/2005 | Aoki et al. | 257/330 |

FOREIGN PATENT DOCUMENTS

JP 4-73951 3/1992

(Continued)

OTHER PUBLICATIONS

Japanese Office Action (with English translation) issued in Japanese Patent Application No. JP 2004-174329, dated Apr. 28, 2008.

*Primary Examiner*—Paul Dinh
(74) *Attorney, Agent, or Firm*—McDermott Will & Emery LLP

(57) ABSTRACT

A layout design method for a semiconductor device includes a step of arranging transistors, a dummy gate forming step of forming dummy gates, which has a shape identical with a shape including gate electrodes or the gate electrodes and projected parts from active regions of the gate electrodes, in positions in parallel with and a fixed distance apart from the gate electrodes arranged at both ends in a gate length direction on active regions of the transistors and, when the transistors have plural gate electrodes with different gate widths, extending the projected parts to the outside of the active regions by a necessary length, a gate connecting step of, when gate patterns and contact regions are connected to the gate electrodes of the transistors, connecting the gate electrodes and the dummy gates according to a positional relation between the gate electrodes and the dummy gates, and a wiring step of wiring a metal layer. It is possible to design a semiconductor device having a smaller area than that in the past and with a less design man-hour.

18 Claims, 31 Drawing Sheets

FOREIGN PATENT DOCUMENTS

| | | |
|---|---|---|
| JP | 10-200109 | 7/1998 |
| JP | 11-234109 | 8/1999 |
| JP | 2000-200882 | 1/2000 |
| JP | 2000-112114 | 4/2000 |
| JP | 2000-223663 | 7/2000 |
| JP | 2001-118988 | 8/2000 |
| JP | 2002-026125 | 4/2001 |
| JP | 2002-190589 | 7/2002 |

* cited by examiner

FIG. 15
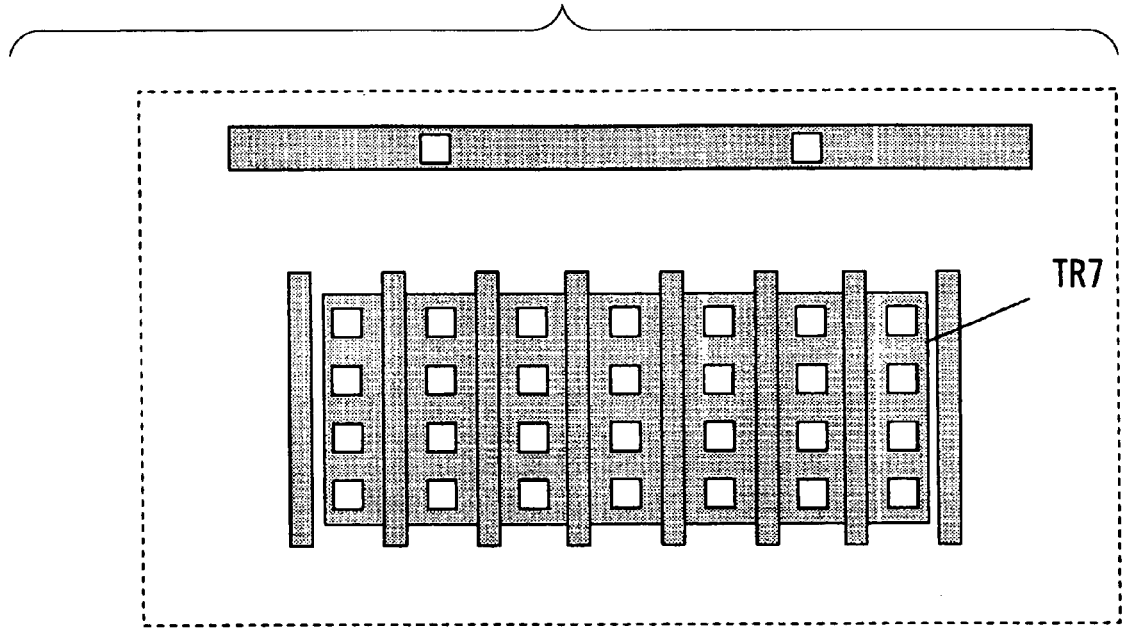
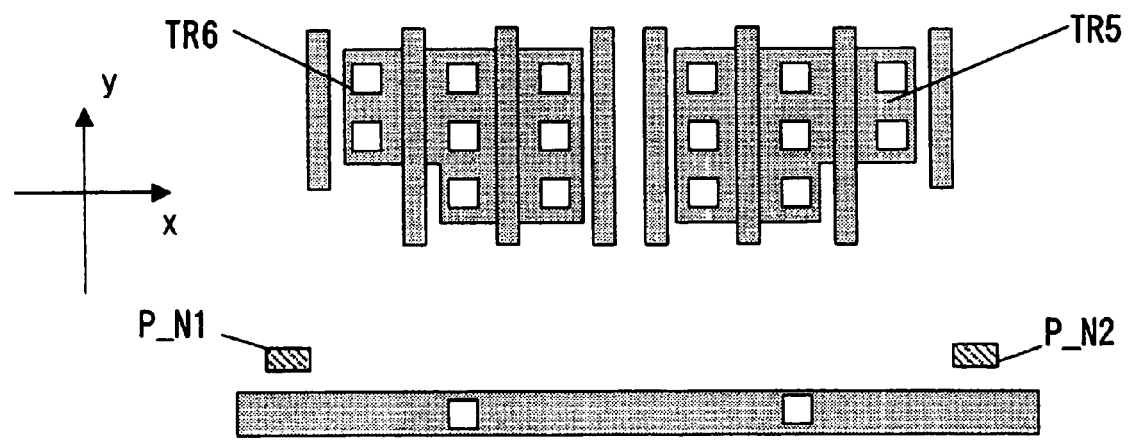

pt1 = LAYOUT PITCH OF UNIT CELL

SEMICONDUCTOR DEVICE AND LAYOUT DESIGN METHOD THEREFOR

BACKGROUND OF THE INVENTION

1. Field of the Invention

The present invention relates to a semiconductor device and a layout design method for the semiconductor device, and in particular to a semiconductor device and a layout design method for the semiconductor device that arrange dummy gates in order to control fluctuation in shapes of gate electrodes of transistors.

2. Description of the Related Art

There is known a layout design method of arranging dummy gates in positions a fixed distance apart from gate electrodes of transistors such that gate patterns are arranged at equal intervals in order to control fluctuation in shapes of the gate electrodes of the transistors. JP-A-2000-200882 (FIG. 1) and JP-A-2000-223663 (FIG. 1) described below mention that the dummy gate is formed in a process identical with that for a gate electrode of an adjacent transistor, has an composition and a shape identical with the gate electrode, and is floating in terms of a potential, connected to a power supply potential, or grounded.

In addition, a JP-A-2002-26125 (FIG. 1) mentions that all gate patterns are formed to match a gate electrode having a longest active region.

However, when layout design is performed to arrange a dummy gate between transistors such that gate patterns are arranged at equal intervals, compared with the case in which a dummy gate is not arranged, a man-hour for arranging the dummy gate and design rules, which should be considered because of the arrangement of the dummy gate, increase. Thus, it is possible that a layout design man-hour and an area increase.

For example, as a layout design method, it is conceivable to adopt a design method of arranging transistors and dummy gates in advance such that gate patterns are arranged at equal intervals and performing a wiring step after that. However, when such layout design is performed, in particular, in a semiconductor device like a memory for which a layout has to be designed within a fixed pitch width or, for example, in order to perform layout design taking into account a yield such as an arrangement of two contacts, it may be inevitable to increase an area in a vertical direction of a pitch width to keep gate patterns within a predetermined pitch width because of restriction of design rules among the gate patterns. In the worst case, it may be inevitable to rearrange the transistors and the dummy gates to repeat the design.

Specifically, the problems will be explained with layout design for a latch circuit shown in FIG. 33 as an example. Here, in order to explain the problems plainly, a layout structure is shown and explained only for an area 33(A) surrounded by a dotted line.

FIG. 34 is a layout in which transistors in the area of 33(A) in FIG. 33 are arranged in a state in which the transistors share source/drain regions as much as possible and dummy gates are arranged to match a largest gate width of gate electrodes provided in the transistors.

Here, pt1 is set as a pitch width in an x direction in the figure that is determined in advance because of design restriction. NW indicates an N-WELL region and other parts are assumed to be a P-WELL region. D_NW and D_PW are active regions that are arranged on N-WELL and P-WELL and used for fixing respective regions in a substrate at a power supply potential or a ground potential. DC indicates contacts. TR1 to 4 are transistors and GA1_1 to GA1_4, GA2_1 to GA2_2, GA3_1 to GA3_4, and GA4_1 to GA4_2 are gate electrodes on the transistors TR1 to 4. EXT_GD is a length of projected parts to the outside of the active region of the gate electrodes.

Dummy gates DG30, 31 connect gate patterns, which are formed to be arranged in parallel with the gate electrodes on TR1 to 2, and TR3 to 4 (in a y direction in the figure) and over a region including the projected parts in a gate width direction of all the gate electrode (in the y direction in the figure). Here, an interval in a gate length direction (an x direction in the figure) between gate patterns of the dummy gates and between the gate electrodes and the dummy gates is a fixed space SP_GA_L. The interval is set to a predetermined length that prevents fluctuation in shapes of the gate patterns. In addition, a width in a gate length direction of the respective gate patterns of the dummy gates (the x direction in the figure) is a minimum gate length LG_min of the gate electrodes.

As shown in FIG. 34, when a transistor has plural gate electrodes with different gate widths, a dummy gate is formed on an extended line in a gate width direction of the gate electrodes. For example, the gate electrode GA1_2 has a small gate width compared with the gate electrode GA1_1 and it is necessary to arrange gate patterns over both ends in a gate width direction of the gate electrode GA1_1. Thus, a dummy gate is formed in a position a minimum spacing SP_GA_min apart from the gate electrode GA1_2 in the gate width direction (in the y direction in the figure) between the gate patterns as encircled by (A1).

As opposed to FIG. 34, FIG. 35 is a diagram in which contact regions for connecting with the gate electrodes are formed and wired using one-layer metal M1. CGMA20 to 28 are regions in which contacts for connecting a gate layer and a metal layer are arranged, which are hereinafter referred to as gate contact regions. SP_M1_min is a minimum spacing rule of the one-layer metal.

In usual layout design, in particular, layout design for a memory, wiring is made by one-layer metal as much as possible. Metal wiring layers of a second layer and upper layers are often used for global wiring for propagation in a long distance such as a power supply wiring and a clock. In this example, wiring by the one-layer metal is performed as much as possible. However, CGMA20 and CGMA21 as well as CGMA24 and CGMA25 cannot be connected unless two-layer metal is used because of restriction of wiring by the one-layer metal.

In (A2) to (A6) encircled by an alternate long and short dash line, the gate contact regions CGMA20, 23, 24, 26, and 28 and the dummy gates DG30 and 31 are required to be arranged complying with the spacing rule SP_GA_min between gate patterns. In (A7) and (A8), the gate contact regions GCMA22 and 23 as well as the gate patterns connecting CGMA27 and CGMA28 are required to be arranged complying with the spacing rule SP_GA_min between gate patterns. In (A9) and (A10), the gate contact region CGMA22 and D_PW as well as CGMA27 and D_NW are required to be arranged complying with a spacing rule between a gate pattern and an active region. As a result, a layout area increases in the y direction in the figure. In addition, in order to secure a yield, it is desired to arrange two or more contacts between metal and gates as much as possible. However, in all the gate contact regions other than GCMA20, 21, and 23, it is impossible to arrange two contacts because of design rules between metals, gate patterns, and the like around the gate contact regions and restriction in terms of an area.

As opposed to FIG. 35, FIG. 36 is a diagram in which a contact CM between the one-layer metal and the two-layer metal is arranged on CGMA20, 21, 24, and 25 and CGMA20 and 21 as well as CGMA24 and 25 are connected by the two-layer metal M2. Therefore, when global wiring is made by two layers of metal on such a layout, it is likely that an area increases because of these wirings.

As described above, in the conventional layout design method, dummy gates having a length matching a gate electrode with a largest gate width are formed to be arranged over both ends in a gate width direction of gate electrodes of all transistors. Thus, positions where gate patterns and gate contact regions connecting with the gate electrodes can be arranged are restricted by a minimum spacing rule between the gate contact regions and the dummy gates. As a result, it is inevitable to reduce the number of contacts or a layout area increases.

In addition, in the arrangement of the gate contact regions, it is necessary to consider a design rule between the gate contact regions and the dummy gates and a metal wiring connecting with the gate contact regions. Thus, layout design is complicated and a design man-hour increases compared with the conventional semiconductor device without dummy gates. In many signal wirings, it is necessary to consider an influence of an area an influence among signals. When wiring correction due to the influences occurs, since it is necessary to consider a design rule for the dummy gates with respect to original layout design, design is complicated and a design man-hour further increases.

In order to place a layout within a predetermined pitch, if transistors and dummy gates are arranged to be placed within the pitch in an initial stage and contact regions and metal wirings are set to match the arrangement, when a design rule cannot be met once, it is likely that all the transistors, dummy gates, contacts, and wirings have to be moved and corrected in the worst case. In such a case, a design back tracking man-hour is large. As a method to avoid such a case, it is possible to change the number of contacts to be arranged from two to one. It is recommended not to take such an avoidance method if possible from the viewpoint of improving a yield.

As described above, the conventional layout design method for semiconductor devices includes many factors causing an increase in an area and a design man-hour or a decline in a yield in arranging dummy gates.

SUMMARY OF THE INVENTION

The invention has been devised in view of the circumstances and it is an object of the invention to provide a semiconductor device that prevents an increase in a chip area and an increase in a design man-hour and is small, and highly reliable, and is made efficiently.

It is another object of the invention to provide a semiconductor device and a layout design method that reduces a layout area and a design man-hour in a semiconductor deice that arranges additional gate patterns for controlling fluctuation in shapes of gate electrodes of transistors In order to solve the problems, the applicant has found that it is possible to prevent an increase in an area and a design man-hour due to a design rule between dummy gates and gate electrodes by, based on shapes of and positional relations among transistors, gate electrodes of the transistors, gate patterns and gate contact regions connecting with the gate electrodes of the transistors, and dummy gates, automatically forming the dummy gate, connecting the dummy gate and the gate electrodes, or changing shapes of the dummy gates. In particular, the applicant has confirmed that, in a logic system circuit, there is no problem in terms of circuit characteristics even if gate electrodes and dummy gates having an area substantially the same as that of the gate electrodes are connected and there is no problem in formation of the gate electrodes either. On the basis of this knowledge, the invention has been devised. Note that, here, the dummy gates, which are originally provided to improve pattern accuracy, functions exceeding a role of the original dummy gates because of electrical connection with the gate electrodes, for example, functions as contact regions. Therefore, the dummy gates are assumed to be first to fifth additional gate patterns described below.

The semiconductor device of the invention is characterized by including first and second additional gate patterns that are formed in parallel with and at a fixed distance from a gate electrode of a first transistor and in a process identical with that for the gate electrode and have a composition identical with that of the gate electrode, and in that the first additional gate pattern and the second additional gate pattern are arranged to be asynchronous to the gate electrode.

With this constitution, the first and the second additional gate patterns are always a fixed distance apart from the gate electrode, but do not always have the same length or width as the gate electrode and can be changed in a shape. Thus, a degree of freedom of design increases and it is possible to prevent an increase in a design man-hour.

The semiconductor device of the invention includes a semiconductor device in which the first additional gate pattern is electrically connected to the gate electrode by a third additional gate pattern.

With this constitution, since the gate electrode and the first additional gate pattern are connected by the third additional gate pattern, the first additional gate pattern, the gate electrode, and the third additional gate pattern are not restricted by a design rule between gate patterns. Thus, an area can be reduced. In addition, it is possible to perform layout design taking into account fluctuation in shapes of gate electrodes.

The semiconductor device of the invention is characterized in that the first additional gate pattern includes a position vector component that is different from that of the gate electrode.

With this constitution, the first additional gate pattern is always a fixed distance apart from the gate electrode, but does not always have the same length and width as the gate electrode and can be changed in a shape. Thus, a degree of freedom of design increases.

In the semiconductor device of the invention, the first additional gate pattern is arranged such that a width changes in a gate length direction of the gate electrode.

With this constitution, the first additional gate pattern serving as a dummy gate is controlled in a width rather than a length that affects a gate pattern significantly. Thus, it is possible to change a design relatively freely without deteriorating pattern accuracy of the gate electrode.

In the semiconductor device of the invention, the first additional gate pattern is arranged such that a width changes stepwise in a gate length direction of the gate electrode.

With this constitution, since the width changes stepwise, it is possible to reduce an entire area of the semiconductor device by controlling an area of the first additional gate pattern to be necessary minimum to secure an area in which other gate patterns can be arranged. This makes it possible to change a design relatively freely without deteriorating pattern accuracy of the gate electrode while minimizing influences on the gate electrode and the additional gate patterns connecting with the gate electrode.

In the semiconductor device of the invention, the first additional gate pattern is connected to a potential different from a power supply potential and a ground potential.

The semiconductor device includes a gate electrode of a designed transistor and first and second additional gate patterns that are arranged in parallel with and at a fixed distance from the gate electrode and formed in a process identical with that for the gate electrode and have a composition identical with that of the gate electrode, and in that the first additional gate pattern is electrically connected to the gate electrode by a third additional gate pattern, is not floating in terms of a potential, and is not connected neither a power supply potential nor a ground potential.

With this constitution, in creation of a gate pattern for connection to the gate electrode, the pattern of the gate electrode and the first additional gate pattern are connected, whereby the gate electrode and the first additional gate electrode are not restricted by a design rule between an additional gate pattern and a gate pattern. Thus, it is possible to reduce an area and it is possible to perform layout design taking into account fluctuation in shapes of gate electrodes.

The semiconductor device of the invention includes a semiconductor device in which the second additional gate pattern is always floating electrically.

Consequently, there is an effect that a degree of freedom of layout design increases by controlling an increase in an area for electrical connection such as wirings and contact regions.

The semiconductor device of the invention includes a semiconductor device in which the second additional gate pattern is connected to a power supply potential or a ground potential.

Consequently, it is also possible to use additional gate patterns not only for controlling fluctuation in gate electrodes but also as capacitive device for fixing a power supply potential or a ground potential.

The semiconductor device of the invention includes a semiconductor device in which the first additional gate pattern has a small area compared with the second additional gate pattern.

With this constitution, even when it is necessary to connect gate electrodes and additional gate patterns because of restriction in terms of an area, it is possible to reduce a load on the gate electrodes by connecting the gate electrodes to additional gate patterns with a smaller area.

The semiconductor device of the invention includes a semiconductor device in which the first additional gate pattern is formed on an active region.

The semiconductor device of the invention includes a semiconductor device in which the first additional gate pattern is formed from an active region to an inactive region.

The semiconductor device of the invention includes a semiconductor device in which the first additional gate pattern is formed on an inactive region.

The semiconductor device of the invention includes a semiconductor device in which a contact for connecting the first additional gate pattern to a metal wiring layer is arranged on the first additional gate pattern.

With this constitution, even when a contact region connecting gate and metal layers cannot be arranged in a projected part of the gate electrode because of wiring restriction of a metal wiring and is required to be arranged around the first additional gate pattern, it is possible to control an increase in an area by arranging the contact region on the first additional gate pattern and connecting the contact region to the gate electrode.

The semiconductor device of the invention includes a semiconductor device in which at least two or more contacts are arranged on first additional gate pattern in parallel with the gate electrode of the first transistor and at a fixed interval from the gate electrode.

With this constitution, since the two or more contacts are arranged on the first additional gate pattern, it is possible to control a decline in a yield. In addition, the contacts are arranged in parallel with the gate electrode and layout design is performed complying with a wiring pitch with a metal wiring connecting with source and drain regions of a transistor. This makes it possible to control an increase in an area of an entire layout due to an increase in an area of a metal layer.

The semiconductor device of the invention includes a semiconductor device in which the first additional gate pattern has a shape identical to a shape of the gate electrode of the first transistor or a shape including the gate electrode and the projected part thereof to the active region.

With this constitution, the first additional gate pattern includes the shape identical to the gate electrode of the transistor and the projected part in condition with area restriction. Thus, it is possible to further reduce fluctuation in shapes of gate electrodes.

The semiconductor device of the invention includes a semiconductor device in which the first additional gate pattern and a fourth additional gate pattern, which is arranged a fixed distance apart from the first additional gate pattern in a gate width direction of the first transistor, are arranged at least over both ends in the gate width direction on the active region of the gate electrode of the first transistor.

With this constitution, it is possible to reduce a load by reducing a length in a gate width direction of an additional gate pattern connecting with gate electrodes of transistors and control fluctuation in shapes of gate electrodes of transistors by arranging another additional gate pattern on an extended line.

The semiconductor device of the invention includes a semiconductor device in which the first additional gate pattern and the fourth additional gate pattern are arranged over the both ends in the gate width direction on the active region of the gate electrode and both ends in a gate width direction on an active region of a gate electrode of a second transistor where the gate electrode is arranged at a fixed interval from the forth additional gate pattern.

With this constitution, it is also possible to control fluctuation in shapes of gate electrodes of transistors by constituting gate electrodes of two transistors apart from each other with two additional gate patterns and reduce a load by reducing a length of one of the additional gate patterns.

The semiconductor device of the invention includes a semiconductor device in which the first transistor has plural gate electrodes, the first gate electrode and the second gate electrode are arranged at both ends in a gate length direction in the active region of the first transistor, respectively, and the first additional gate pattern and the second additional gate pattern are arranged over both ends in a gate width direction of a first gate electrode and a second gate electrode arranged at a fixed distance from the first additional gate pattern and the second additional gate pattern respectively.

With this constitution, it is possible to control fluctuation in shapes of gate electrodes and perform design with a less restriction on an area by setting the first and the second additional gate pattern to a length in the gate width direction at least required for controlling fluctuation in shapes of the first and the second gate electrodes of the transistors.

The semiconductor device of the invention includes a semiconductor device in which the first additional gate pattern is arranged in a region from both the ends in the gate width direction of the gate electrode of the first transistor to both ends in a gate width direction on an active region of a gate electrode of a second transistor where a gate electrode is arranged at a fixed interval from the first additional gate pattern and which is arranged in parallel with the first transistor.

With this constitution, the first additional gate patterns are opposed to gate electrodes of adjacent two or more transistors. Thus, the first transistor and the second transistor share a first additional gate pattern as a dummy gate, whereby it is possible to reduce a man-hour for formation of additional gate patterns.

In the semiconductor device of the invention, the first additional gate pattern and the second additional gate pattern have different lengths by projection parts from both the ends in the gate width direction of the active region of the first transistor a fixed distance apart from the first additional gate pattern and the second additional gate pattern.

With this constitution, additional gate patterns are arranged with necessary length according to a shape and an arrangement condition of transistors and gate pattern, to selectively delete projection parts for a region that is limited by a rule between gate patterns including the additional gate patterns in terms of an area. Thus, it is possible to shown an effect of dummy gates while preventing an increase in an area and perform layout design that affects the other gate patterns less and with which a layout area is reduced.

The semiconductor device of the invention includes a semiconductor device in which a first transistor has plural gate electrodes, the first and second additional gate patterns, which are formed at a fixed distance from and in a process identical with that of gate electrodes arranged at both ends in a gate length direction of the first transistor, are arranged in an shape identical with that of the gate electrodes, and a first gate electrode arranged on an active region of the first transistor is extended to an outside of an active region of the first transistor in a gate width direction of the first gate electrode to range over at least both ends in a gate width direction on an active region of a second gate electrode arranged a fixed distance apart from the first gate electrode.

With this structure, by arranging additional gate patterns for a required region according to arrangement positions of gate electrodes on transistors, since other gate patterns are less affected than arranging additional gate patterns with a certain length uniformly, it is possible to perform layout design with a reduced area. In addition, by extending the first gate electrode without a man-hour for forming additional gate patterns, the additional gate patterns can play a role of additional gate patterns for the second gate electrode.

The semiconductor device of the invention includes a semiconductor device in which a contact for connecting with a metal wiring layer is arranged in a position to which the first gate electrode is extended to the outside of the active region.

With this constitution, it is possible to connect a contact region to a projected part of any one of the gate electrodes as well according to a positional relation of a wiring of a metal layer and a gate pattern by extending gate electrodes without forming excess additional gate patterns. Thus, since it is possible to perform layout design corresponding to a layout restriction, as a result, it is possible to reduce a layout area.

The semiconductor device of the invention includes a semiconductor device that includes a second transistor in addition to the first transistor and in which an additional gate pattern, which is arranged in parallel with and at a fixed distance from a gate electrode on an active region of the first transistor and a gate electrode of an active region of the second transistor, formed in a process identical with that for the gate electrodes of the first and the second transistors, and has a composition identical with that of the gate electrodes, has different lengths in a gate length direction of the first gate electrode stepwise in a region from both ends in a gate width direction on the active region of the gate electrode of the first transistor to both ends in a gate width direction on the active region of the gate electrode of the second transistor.

With this structure, it is possible to realize a reduction in an overall area by controlling an occupied area of the first additional gate pattern to be necessary minimum and securing an area in which other gate patterns can be arranged.

In addition, when two additional gate patterns do not meet a design rule, the two additional gate patterns are connected while keeping shapes thereof. This makes it possible to secure an effect as additional gate patterns and secure an arrangement area for other gate patterns compared with the case in which the additional gate patterns are formed simply in a rectangular shape. Thus, it is possible to reduce a layout area.

In the semiconductor device of the invention, since the additional gate patterns opposed to the gate electrodes of the first and the second transistors are arranged, it is unnecessary to consume a man-hour for complying with a design rule between additional gate patterns and form additional gate patterns having a shape corresponding to the gate electrodes of the respective transistors. Thus, it is possible to perform layout design with a less design man-hour.

In addition, with this constitution, a restriction of a design rule between additional gate patterns and gate patterns is prevented simply by changing a length parts of the additional gate patterns opposed to projected parts of gate electrode parts as required. Thus, it is possible to reduce a man-hour and reduce an occupied area to perform layout design. Further, since the additional gate patterns are formed in range opposed to the gate electrodes, it is needless to mention that there is an effect of controlling fluctuation in shapes.

A layout design method for a semiconductor device of the invention includes: a transistor forming step of arranging a transistor having one or plural gate electrodes; and an additional gate pattern forming step of forming an additional gate pattern in parallel with and at a fixed distance from gate electrodes arranged at both ends in a gate length direction of an active region of the transistor and in a length over at least a gate width direction of the gate electrodes.

According to this layout design method, it is possible to arrange additional gate patterns proportionate to the arranged transistor automatically and as many as necessary. Thus, it is possible perform layout design with high design efficiency and with a reduced area.

The layout method for a semiconductor device of the invention is characterized by including a transistor forming step of arranging a transistor having one or plural gate electrodes; and an additional gate forming step of forming first and second gate patterns that are formed in parallel with and at a fixed distance from the gate electrodes of the transistor and in a process identical with that for the gate electrodes and has a composition identical with that of the gate electrodes, and in that the first and the second additional gate patterns are formed to be allowed to be asymmetrical to the gate electrodes.

The first and the second additional gate patterns is possible to be formed and obtained in different regions in a gate width direction of the transistor.

According to this layout design method, an additional gate pattern is formed in a necessary area according to arrangement condition of gate electrodes of transistors. Thus, there is an effect in a reduction of an area compared with a layout design method of arranging additional gate patterns in an identical shape and in an identical region at fixed distance apart from a transistor.

In the layout design method, the transistor forming step or the additional gate pattern forming step includes a step of extending a first gate electrode included in the transistor to the outside of an active region, at least to a range over both ends in a gate width direction on an active region of an adjacent second gate electrode arranged on the identical active region of the transistor.

According to this layout design method, when a gate electrode does not oppose to overall gate width portion of an adjacent gate electrode, it is necessary to arrange an additional gate pattern. However, since the gate electrode is extended to cope with the necessity, the layout design method leads to a reduction in a layout design man-hour.

The additional gate pattern forming step of the layout design method of the invention includes a step of, when the transistor includes a first gate electrode and second and third gate electrodes arranged at a fixed distance from the first gate electrode and the second gate electrode and the third gate electrode are arranged linearly at an interval equal to or larger than the fixed distance in the gate width direction, extending a projected part to the outside of an active region of the second gate electrode and the third gate electrode or forming an additional gate pattern between the second gate electrode and the third gate electrode.

According to this layout design method, even when range of plural gate electrodes in gate width direction has not enough to oppose to the both end of adjacent gate electrode in identical transistor, it is possible to judge whether an additional gate pattern is formed automatically or a projected part of the gate electrode is extended to the outside of the active region and realize the same effect as the additional gate pattern. Thus, it is possible to reduce a layout design man-hour.

A layout design method of the invention includes: a transistor forming step of arranging a transistor having one or plural gate electrodes; an additional gate pattern forming step of arranging an additional gate pattern in parallel with and at a fixed distance from gate electrodes arranged at both ends in a gate length direction of an active region of the transistor; and a connecting step of connecting a gate pattern to the gate electrodes of the transistor or arranging a contact region. The connecting step includes a step of, when the gate pattern connecting with the gate electrodes and the contact region are arranged within a fixed distance from the first additional gate pattern, connecting the first additional gate pattern and the gate electrode or changing a length of the first additional gate pattern in the gate width direction to both the ends of the gate electrodes in active region of the transistor.

According to this layout design method, even when the gate pattern or the contact region connecting with the gate electrodes does not meet a design rule between the gate pattern or the contact region and the additional gate pattern, it is unnecessary to consider the design rule by automatically connecting with the gate electrodes according to an arrangement condition for the gate pattern and the contact or changing length of additional gate in region opposed to the projected part of gate electrode. Thus, it is possible perform layout design with an area reduced efficiently.

In the layout design method of the invention, the connecting step includes a step of, if a length in the gate width direction of the gate electrode of the first additional gate pattern connected to the gate electrode of the transistor is equal to or longer than a fixed length, dividing the first additional gate pattern and arranging a fourth additional pattern at a fixed distance from the first gate pattern.

According to this layout design method, since the additional gate pattern connecting with the gate electrode is equal to or longer than a certain length, the additional gate pattern is divided automatically and an additional gate pattern compensating for the additional gate pattern is arranged. Thus, it is possible to control fluctuation of gate electrodes and automatically perform layout design with less load of the gate electrode, at the time when the gate electrode is connected to the additional gate pattern.

The layout design method of the invention further includes a moving step of moving the transistor formed in the transistor forming step and the additional gate pattern formed in the additional gate pattern forming step while keeping an arrangement relation of the transistor and the additional gate pattern.

According to this layout design method, even when the transistor has to be moved because of an arrangement condition of a metal layer and gate patterns around the transistor, it is possible to reduce a layout change man-hour due to the movement of the transistor by moving the transistor and the additional gate pattern while keeping a positional relation of the transistor and the additional gate pattern.

The layout design method of the invention further includes an additional gate pattern correcting step of, when the first and the second additional gate patterns formed in the additional gate pattern forming step are arranged within a fixed distance, connecting the first and the second additional gate pattern.

According to this layout design method, when additional gate patterns do not meet a design rule, it is possible to perform layout design meeting the design rule between the additional gate pattern by connecting the additional gate patterns without consuming a design man-hour for movement and correcting transistors and gate patterns around the additional gate patterns.

In the additional gate pattern correcting step of the layout design method of the invention, a shape of the first additional gate pattern or the second additional gate pattern is changed or a fifth additional gate pattern is formed between the first and the second additional gate patterns.

According to this layout design method, when additional gate patterns do not meet a design rule, if a part of the additional gate patterns cannot be corrected or shapes of the additional gate patterns cannot be corrected because of a hierarchical structure of design data, it is possible to correct the additional gate patterns while minimizing a change of the design data by forming an additional gate pattern anew.

In the additional gate pattern correcting step of the layout design method of the invention, the shape is changed or the additional gate pattern is formed such that only a region within a fixed distance between the first additional gate pattern and the second additional gate pattern are filled by the additional gate pattern.

According to this layout design, it is possible to correct design to meet a design rule between additional gate patterns while the additional gate pattern correcting step does not affect other gate patterns by performing correction for minimizing the additional gate patterns in terms of an area in order to meet the design rule between the additional gate patterns.

BRIEF DESCRIPTION OF THE DRAWINGS

FIG. 15 is a layout of the semiconductor device, in which the additional gate patterns are arranged, designed by the layout design method in the second embodiment.

DESCRIPTION OF THE PREFERRED EMBODIMENTS

A semiconductor device and a layout design method according to embodiments of the invention will be hereinafter explained in detail with reference to the drawings.

First Embodiment

Figure 1:
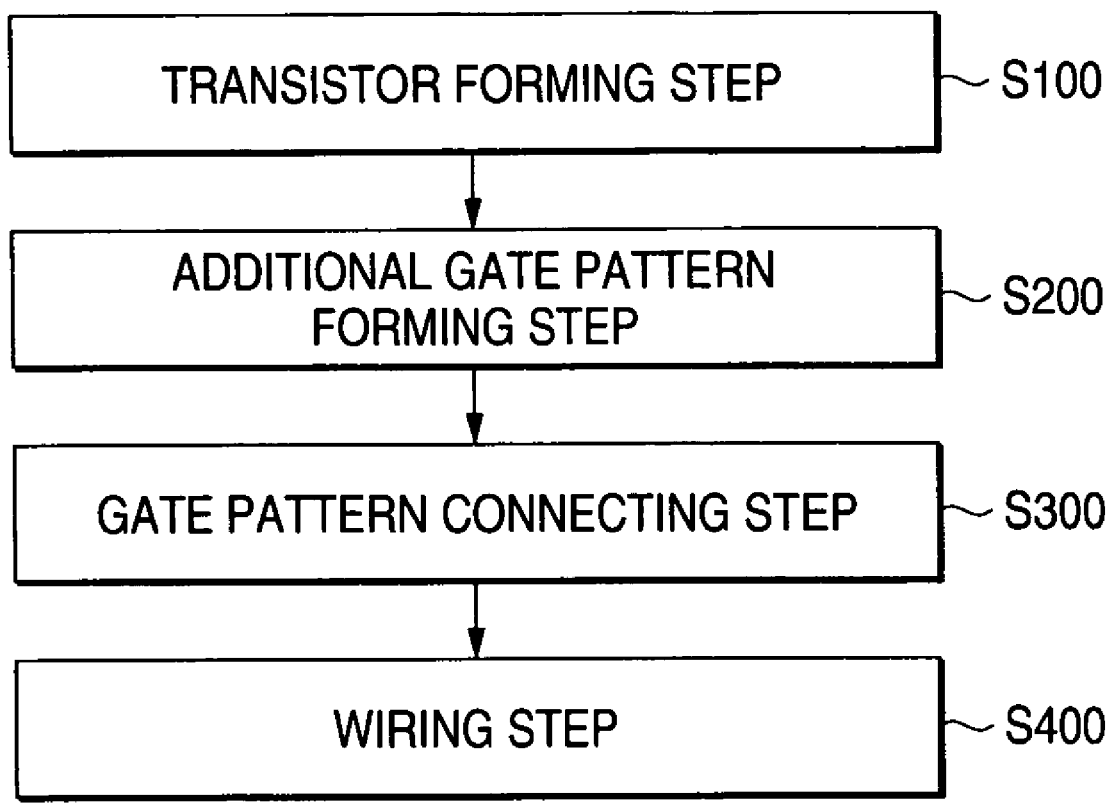
FIG. 1 is a flow diagram for explaining a layout design method for a semiconductor device in which additional gate patterns are arranged in a first embodiment.
Figure 33:
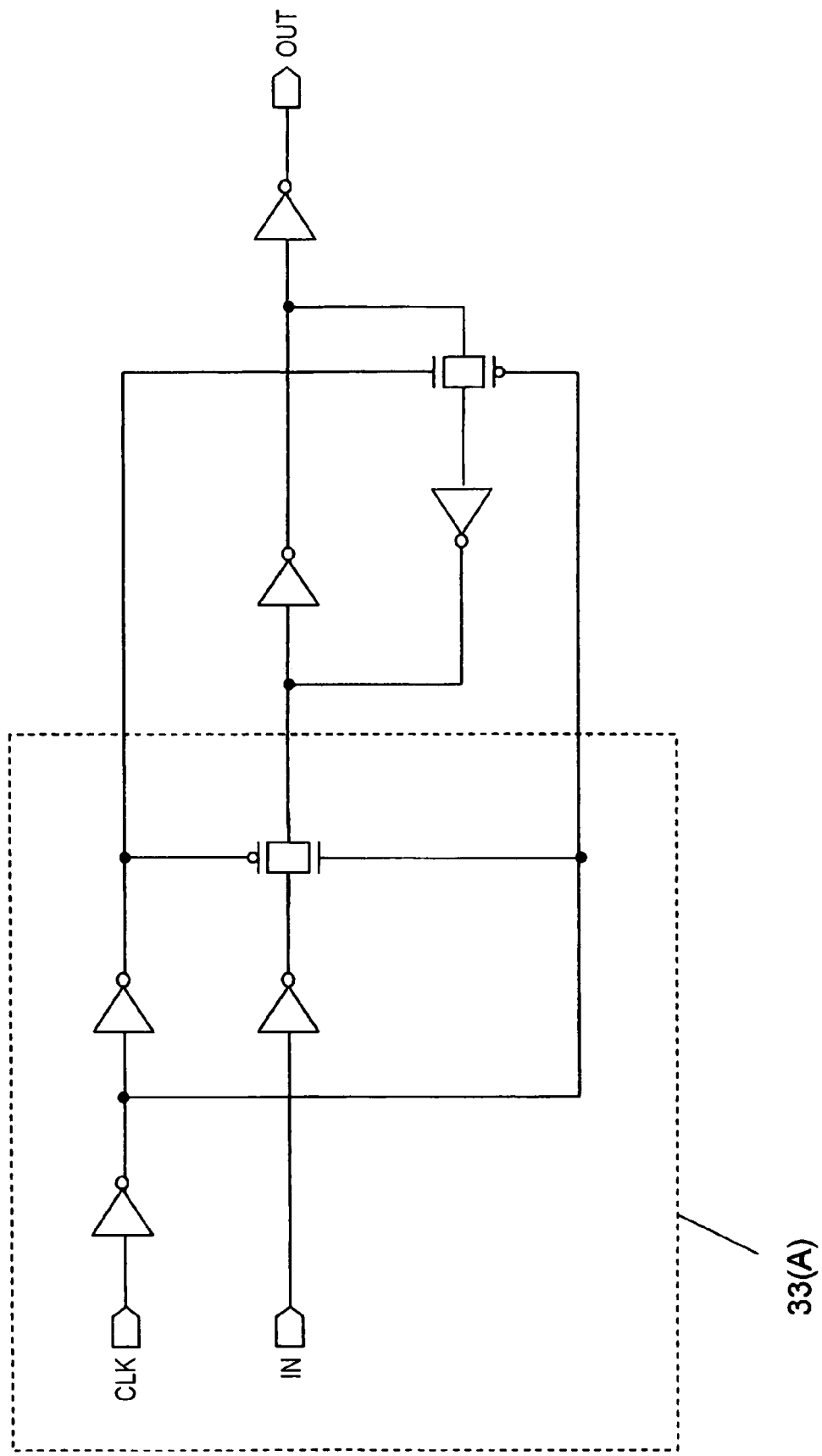
FIG. 33 is a latch circuit of a general semiconductor device.

FIG. 1 is a diagram showing a flow of the layout design method of the invention. After a transistor forming step S100, an additional gate pattern forming step S200 of forming an additional gate pattern serving as a dummy gate in parallel with and at a fixed distance from a gate electrode of a transistor is performed, and a gate pattern connecting step S300 of connecting a gate pattern or a gate contact region to the formed gate electrode of the transistor and arranging the gate pattern or the gate contact region and a wiring step S400 of wiring a metal layer are executed. The respective steps will be hereinafter explained with layout design of a region surrounded by 33(A) of a latch circuit shown in FIG. 33 as an example.

Figure 2:
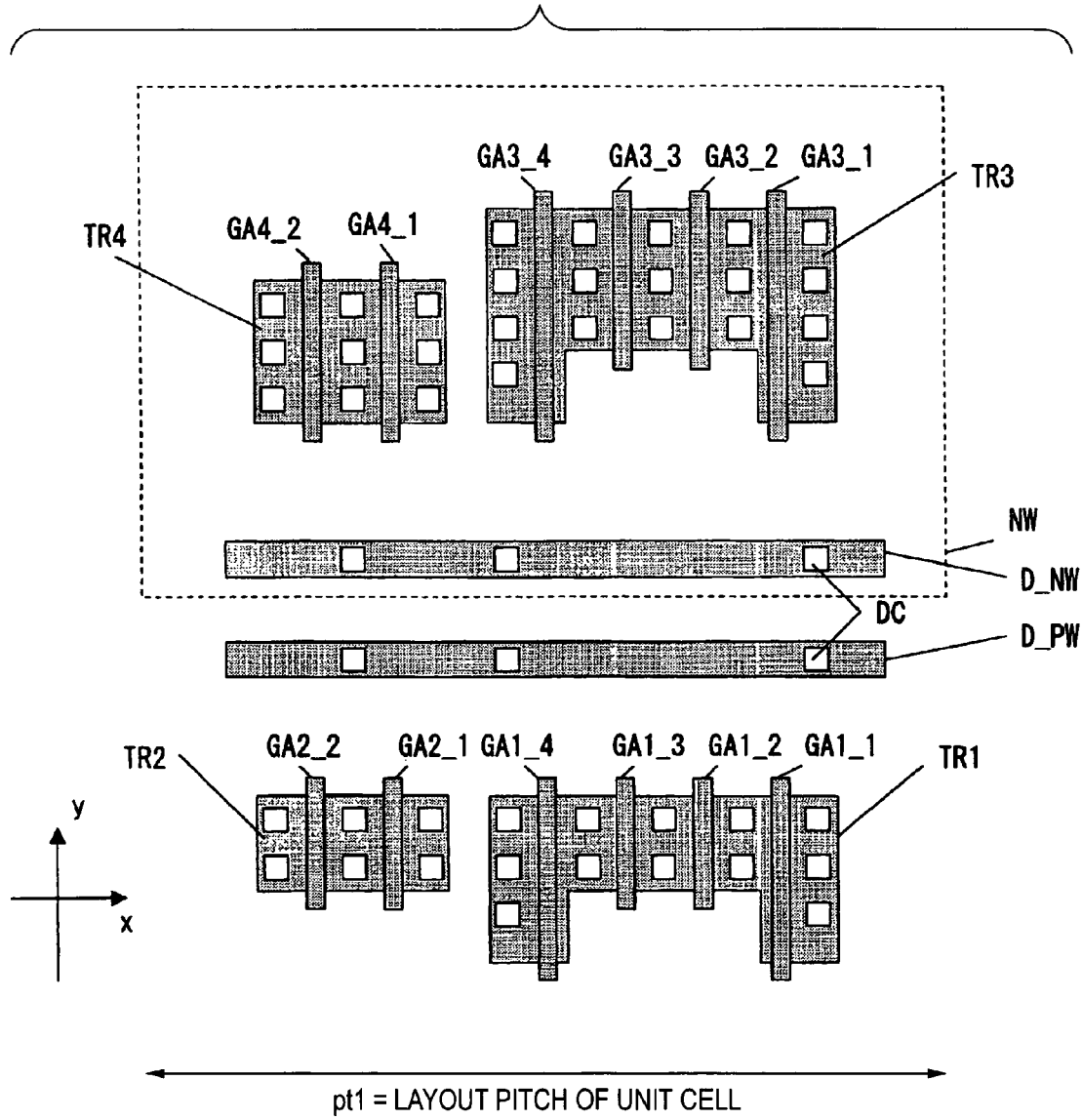
FIG. 2 is a layout diagram of a semiconductor device in which additional gate patterns are arranged, designed by the layout design method in the first embodiment.

FIG. 2 is a layout diagram of transistors TR1 to TR4 formed in the transistor forming step S100. The transistors TR1 and TR3 have gate electrodes GA1_1 to GA1_4 and GA3_1 to GA3_4 with different gate width. The transistors TR2 and TR4 have gate electrodes GA2_1 and GA2_2 as well as GA4_1 and GA4_2 with the same gate width.

Figure 3:
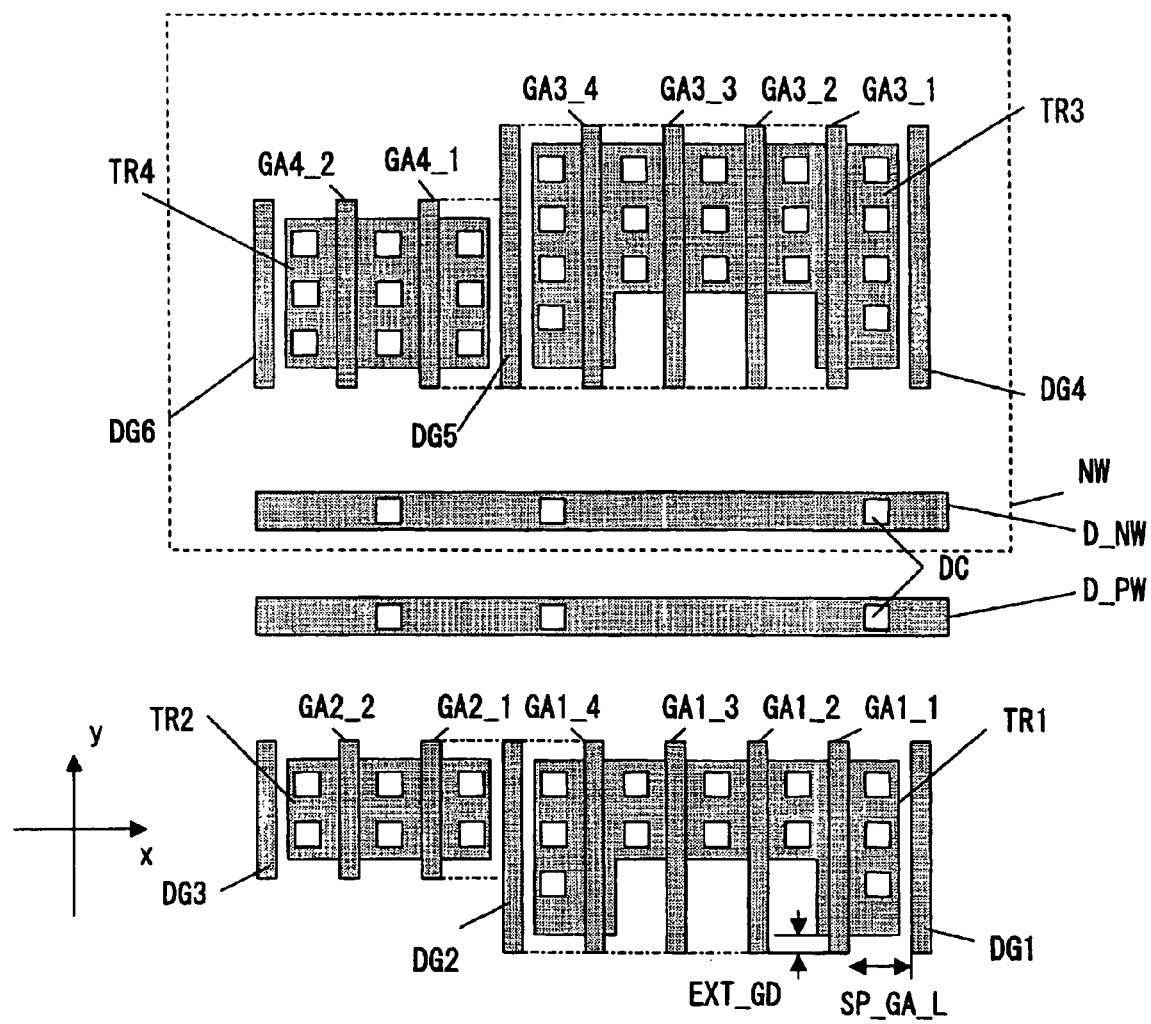
FIG. 3 is a layout diagram for the semiconductor device in which the additional gate patterns are arranged, designed by the layout design method in the first embodiment.
Figure 34:
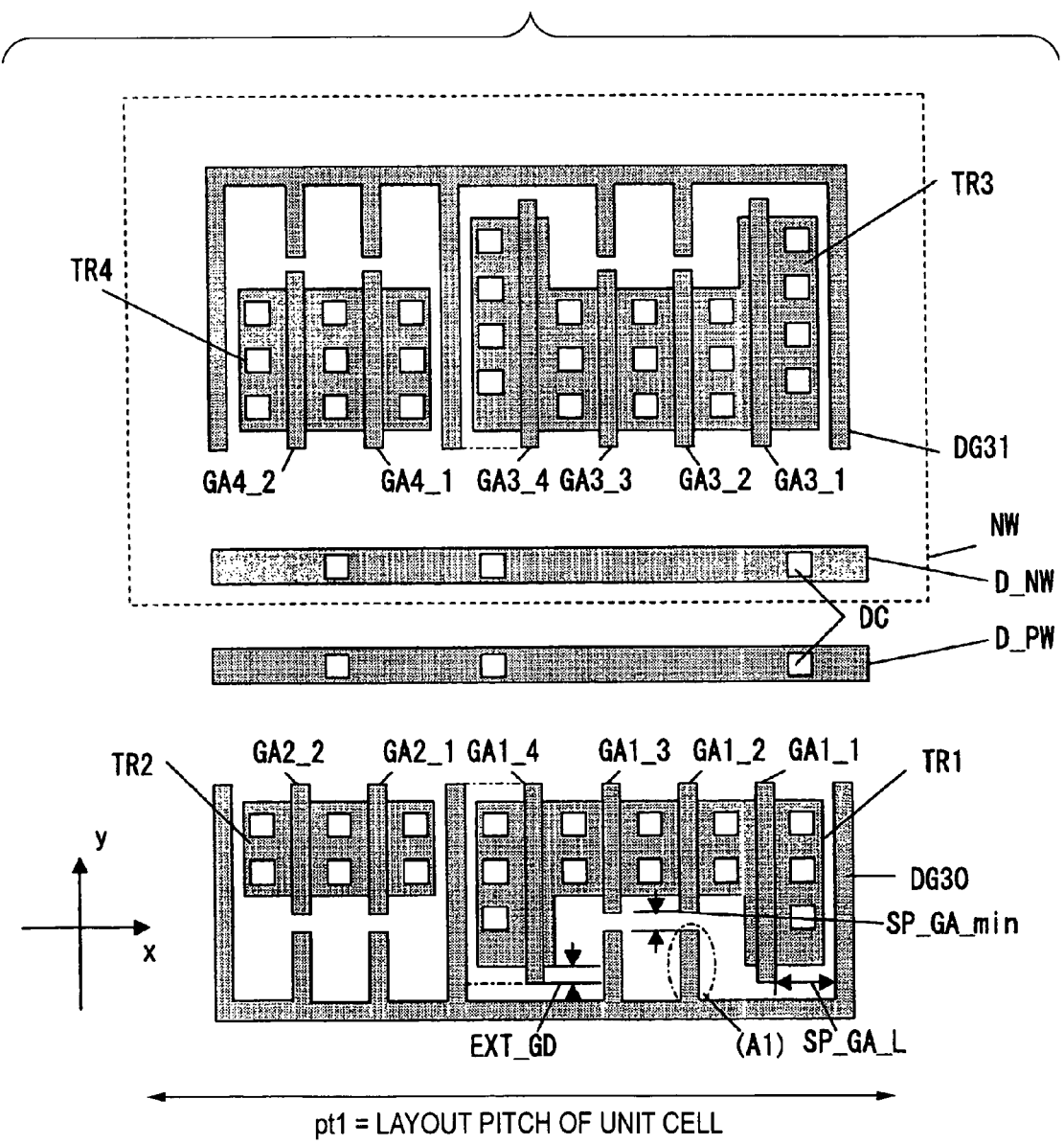
FIG. 34 is a layout of a semiconductor device in which additional gate patterns are arranged, created by a conventional layout design method.

FIG. 3 is a layout diagram of additional gate patterns DG1 to 6 formed by the additional gate pattern forming step S200. The gate patterns DG1 to 6 are arranged in a position a fixed distance SP_GA_L apart in a gate length direction from the gate electrodes GA1_1, GA1_4, GA2_1, and GA2_2 as well as GA3_1, GA3_4, GA4_1, and GA4_2 at both ends in a gate length direction of the transistors TR1 and TR2 as well as TR3 and TR4, that is, an x direction and are formed to occupy a region in the same gate width direction (a y direction in the figure) as indicated by an alternate long and short dash line including a length of a projection from an active region. Note that, in this example, a first additional gate pattern, which is formed to be opposed to the gate electrode GA1_4, includes an additional gate patter, which is formed to be opposed to GA2_1, and is represented as DG2. Concerning DG5, similarly, an additional gate pattern opposed to GA3_4 includes an additional gate pattern formed to be opposed to GA4_1. FIG. 3 is different from FIG. 34 in that, instead of not forming dummy gate patterns on extended lines in a gate width direction of the gate electrodes GA1_2 and GA1_3 as well as GA3_2 and GA3_3, the gate electrodes GA1_2 and GA1_3 as well as GA3_2 and GA3_3 are extended in a gate width direction (a −y direction in the figure) to change a size in the gate width direction to include the adjacent gate electrodes GA1_1 and GA1_4 as well as GA3_1 and GA3_4 and projected parts to the outside of active regions thereof.

Figure 4:
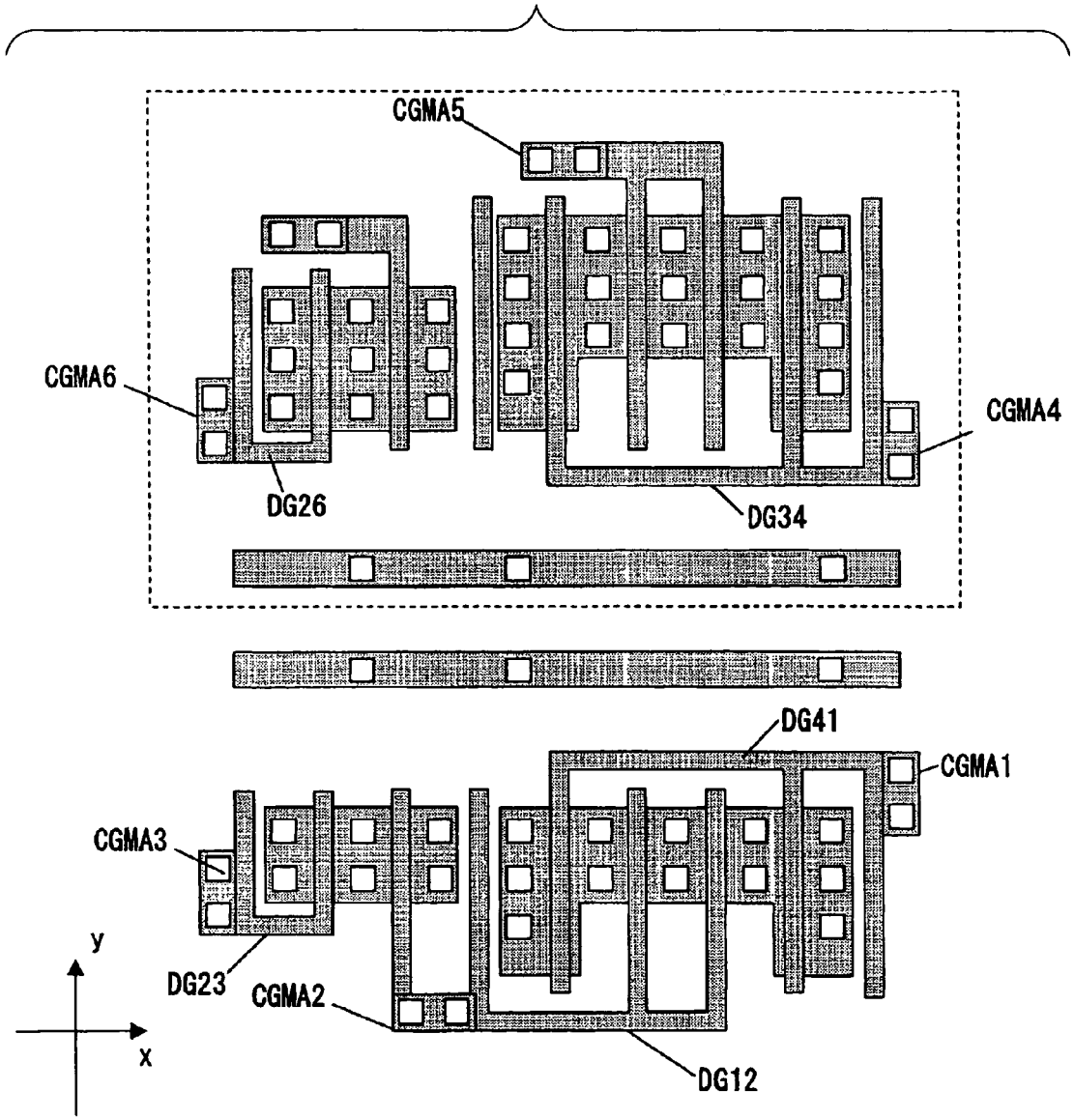
FIG. 4 is a layout diagram for the semiconductor device in which the additional gate patterns are arranged, designed by the layout design method in the first embodiment.
Figure 35:
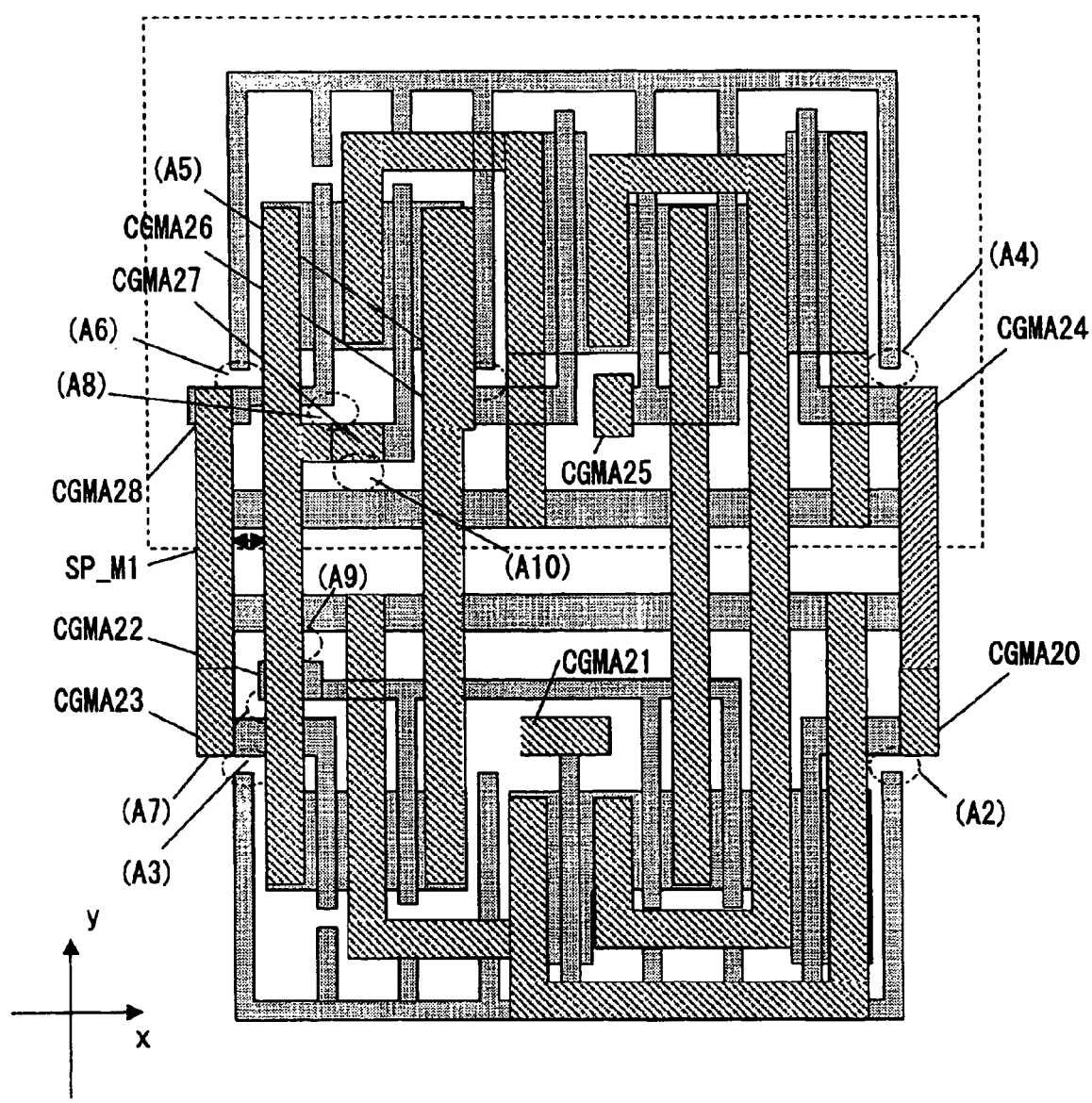
FIG. 35 is a layout of the semiconductor device in which the additional gate patterns are arranged, created by the conventional layout design method.

FIG. 4 is a diagram in which the gate electrodes GA1_1 to GA1_4, GA2_1 to GA2_2, GA3_1 to GA3_4, and GA4_1 to GA4_2 and the first additional gate patterns or gate contact regions are connected. Gate contact regions CGMA1 to 4, 6 are connected to additional gate patterns DG1 to 4, 6, respectively. Consequently, a design rule between gate patterns or gate contact regions connecting with additional gate patterns and gate electrodes is eliminated. Thus, compared with FIG. 35, a restriction in terms of an area of a layout by a design rule between gate patterns is reduced. The contact CGMA 2 is connected in a position extended to the outside of active regions of the gate electrodes GA1_2 and GA1_3.

Figure 6:
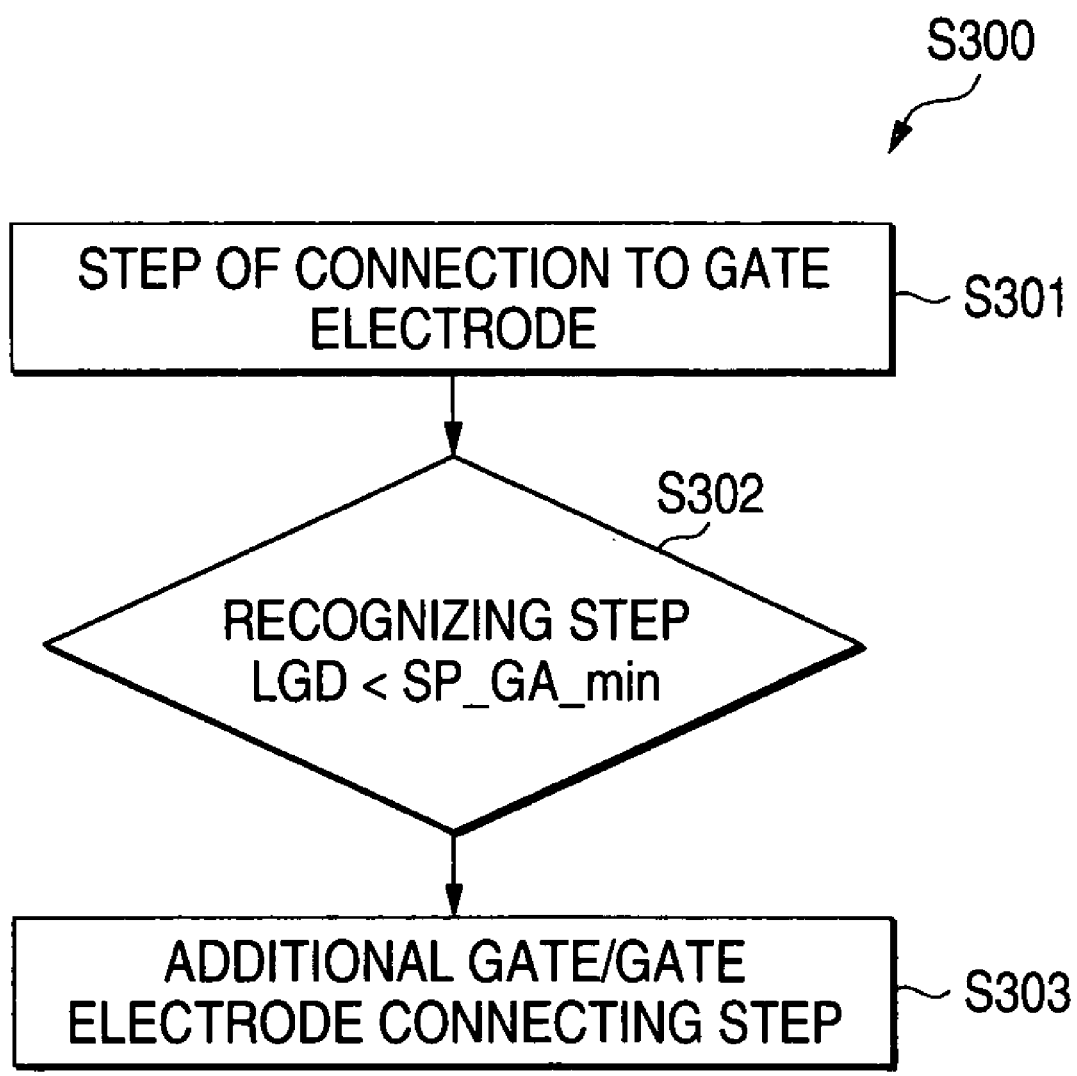
FIG. 6 is a flow diagram for explaining a gate pattern connecting step S300 in the first embodiment.

FIG. 6 is a diagram showing processing in the gate pattern connecting step S300. The connecting step S300 includes a connection to gate electrode step S301 of arranging and connecting a gate pattern or a gate contact to a gate electrode of a transistor, a recognizing step S302 of recognizing an interval LGD between the arranged gate pattern or contact region and the additional gate pattern and performing conditional branch of execution processing, and an additional gate pattern/gate pattern connecting step S303 of connecting the additional gate pattern and the gate electrode when the interval LGD is shorter than a fixed distance SP_GA_min.

Figure 7:
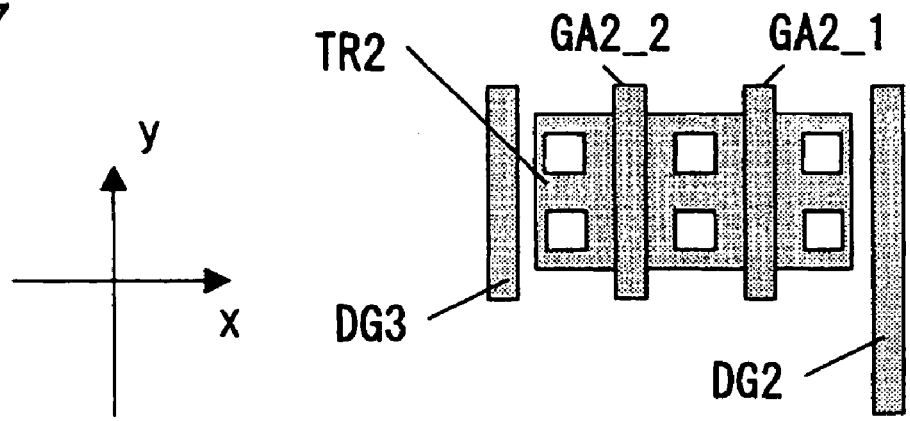
FIG. 7 is a layout diagram of a semiconductor device in which additional gate patterns are arranged for explaining the gate pattern connecting step S300 in the first embodiment.

Processing in the gate pattern connecting step S300 will be explained with reference to FIGS. 7 to 11. FIG. 7 is an excerpt of only the section of the transistor TR2 from FIG. 3.

Figure 8:
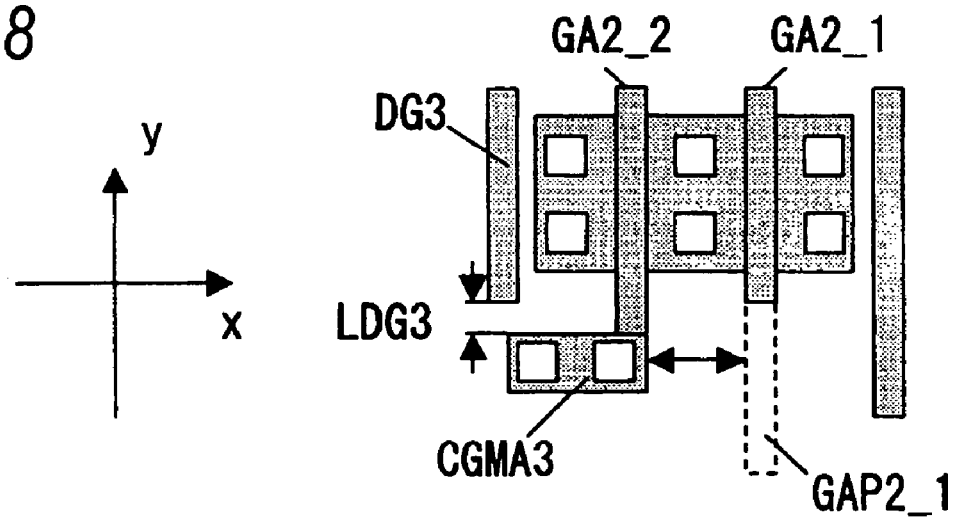
FIG. 8 is a layout diagram of the semiconductor device in which the additional gate patterns are arranged for explaining the gate pattern connecting step S300 in the first embodiment.

First, the gate contact region CGMA3 is arranged to connect with the gate electrode GA2_2 (FIG. 8). In the case of this example, the gate contact region CGMA3 is arranged near the additional gate pattern DG3 in order to secure a fixed distance (SP_GA_min) or more from a gate pattern GAP_21 connecting with the gate electrode GA2_1 and not to increase an area. At this instance, in the recognizing step S302, it is recognized that LDG3<SP_GA min from the interval LDG3 between the gate contact region CGMA3 and the additional gate pattern DG3, and the step S303 of connecting the gate electrode GA2_2, the gate contact region CGMA3, and the additional gate pattern DG3 from the conditional branch in the recognizing step in S302 is executed (FIG. 9).

Figure 10:
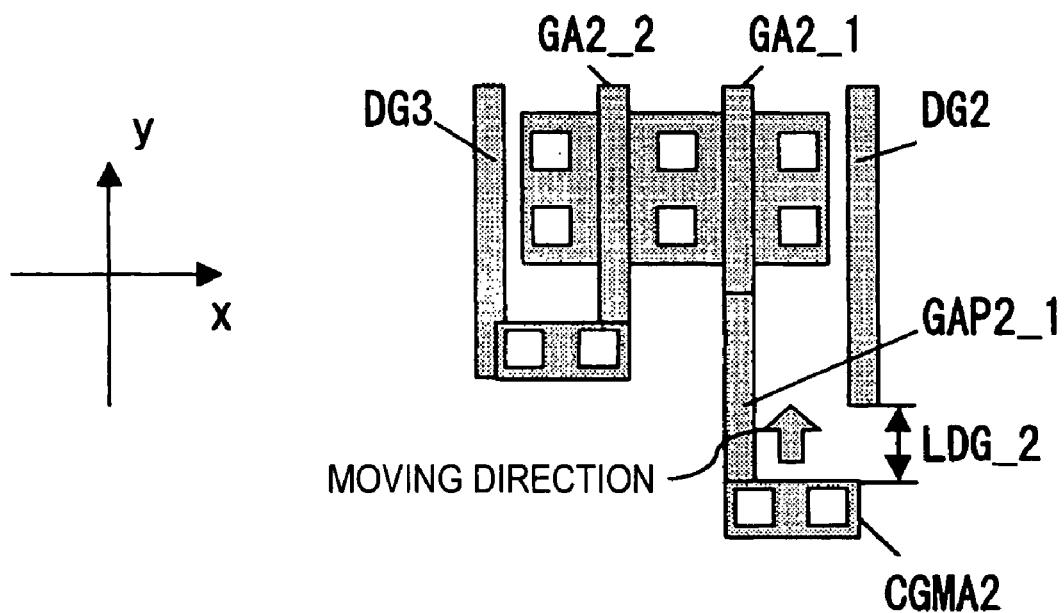
FIG. 10 is a layout diagram of the semiconductor device in which the additional gate patterns are arranged for explaining the gate pattern connecting step S300 in the first embodiment.
Figure 11:
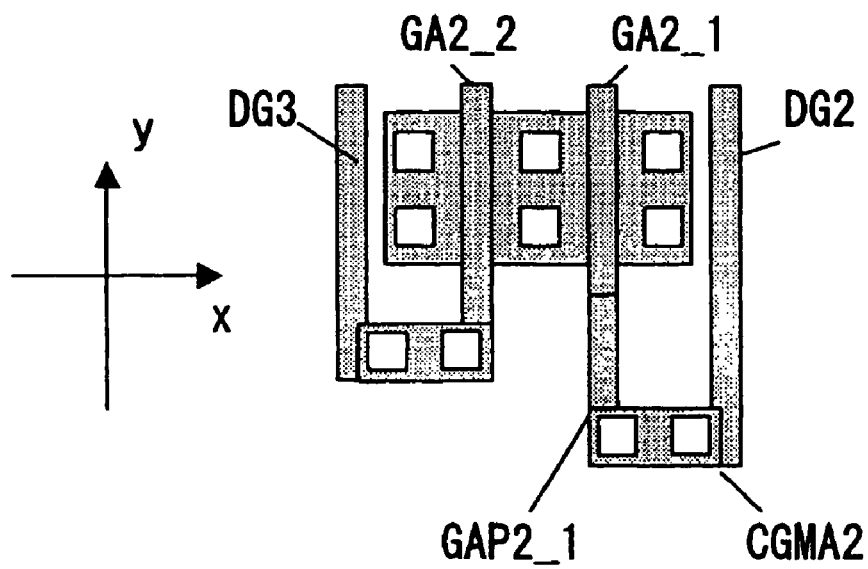
FIG. 11 is a layout diagram of the semiconductor device in which the additional gate patterns are arranged for explaining the gate pattern connecting step S300 in the first embodiment.

Subsequently, the gate contact CGMA2 is connected to the gate electrode GA2_1 via the gate pattern GAP2_1 in a position sufficiently distant from the additional gate pattern DG2 (FIG. 10). At this time, since the contact CGMA2 and the gate pattern GAP2_1 are apart from the additional gate pattern by SP_GA_min or more, respectively, the contact CGMA2 and the gate pattern GAP2_1 are not connected. Here, in order to reduce an area, the contact CGMA2 is moved in a + direction of a y axis in the figure to be brought close to the additional gate pattern DG2. When the contact CGMA2 is moved to a position where the distance LDG2 between the additional gate pattern DG2 and the contact CGMA2 is LDG2<SP_GA_min, processing is performed in the recognizing step S302, and the additional gate pattern, the gate pattern GAP_21, and the contact CGMA2 are connected (FIG. 11). In this way, in the gate pattern connecting step S300, when a gate pattern or a contact region are connected to a gate electrode or when a gate pattern or a contact region connecting with a gate electrode are moved, if a distance between the gate pattern or the contact region and the additional gate pattern is reduced to the fixed distance SP_GA_min or less, processing connection with the additional gate pattern is automatically executed. Thus, a designer is capable of performing layout design without being conscious of a design rule between the gate pattern or the contact region and the additional gate pattern. Moreover, the additional pattern/gate electrode connecting step S303 of connecting the additional gate pattern and the gate electrode includes a step of converting an additional gate pattern, which is usually arranged as a dummy gate defined differently from the gate electrode as layout data because of mask processing or the like, into an identical definition as the gate electrode once. Thus, the designer is capable of connecting the additional gate pattern and the gate electrode without consuming a man-hour required for the conversion.

Figure 5:
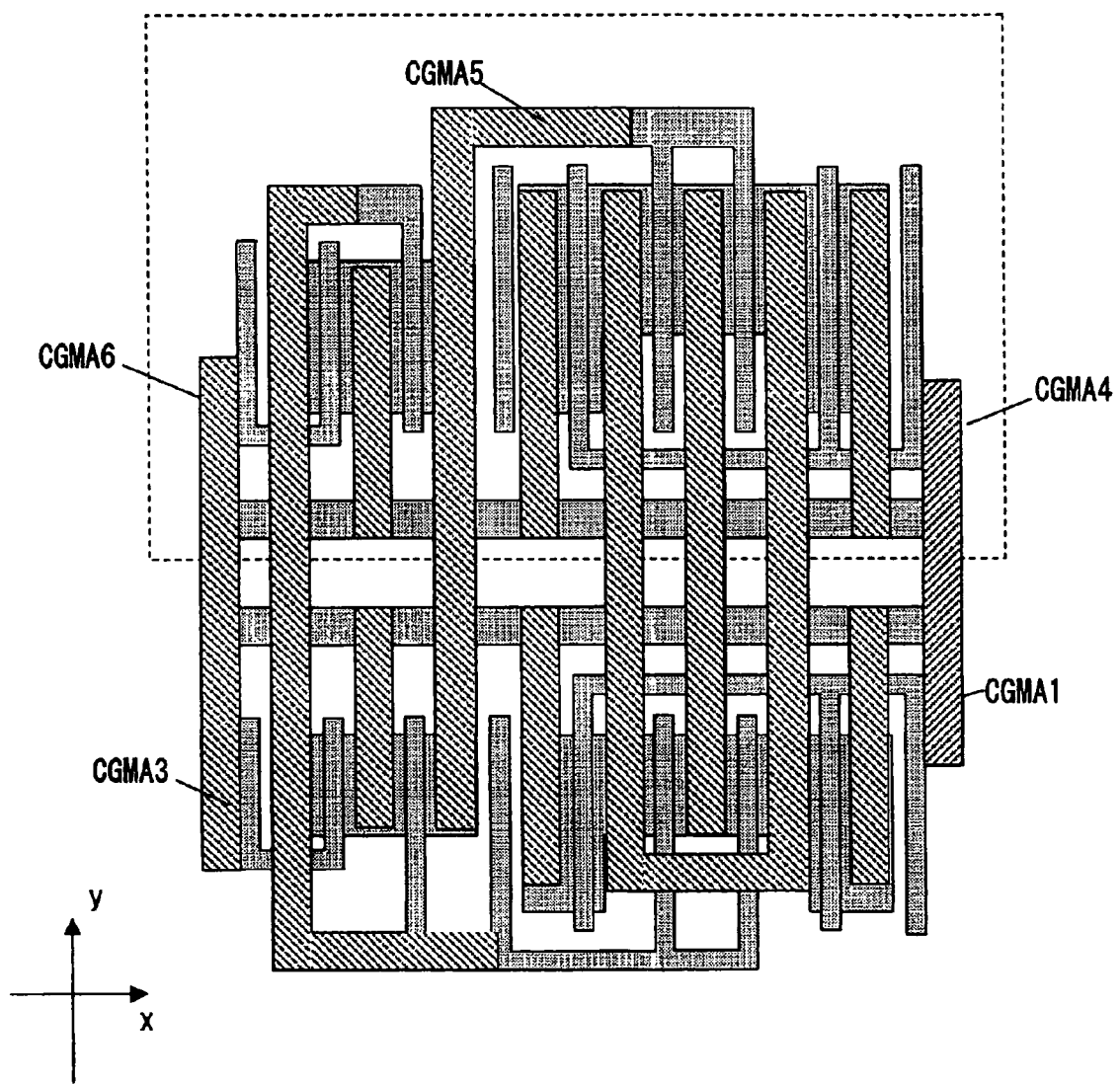
FIG. 5 is a layout diagram for the semiconductor device in which the additional gate patterns are arranged, designed by the layout design method in the first embodiment.

As opposed to FIG. 4, FIG. 5 is a diagram in which wiring is made with one layer of metal in the wiring step S400. Note that it is assumed that wiring with a power supply is made with not-shown two layers of metal.

Figure 9:
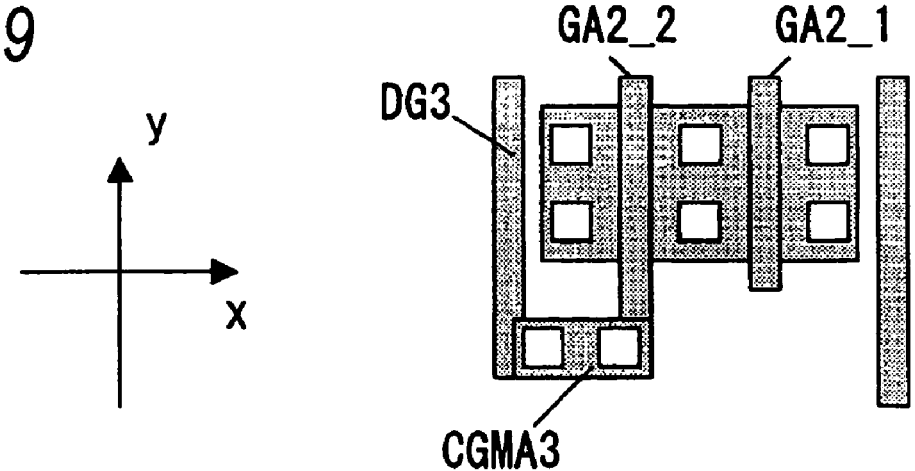
FIG. 9 is a layout diagram of the semiconductor device in which the additional gate patterns are arranged for explaining the gate pattern connecting step S300 in the first embodiment.

Here, the CGMA3 is arranged in a position different from that in FIG. 9 because an area is smaller from a spacing rule of one-layer metal or the like when the CGMA3 is arranged such that a contact is arranged in the gate width direction of the gate electrode, in this case, in the y direction in the figure on the additional gate pattern.

Figure 36:
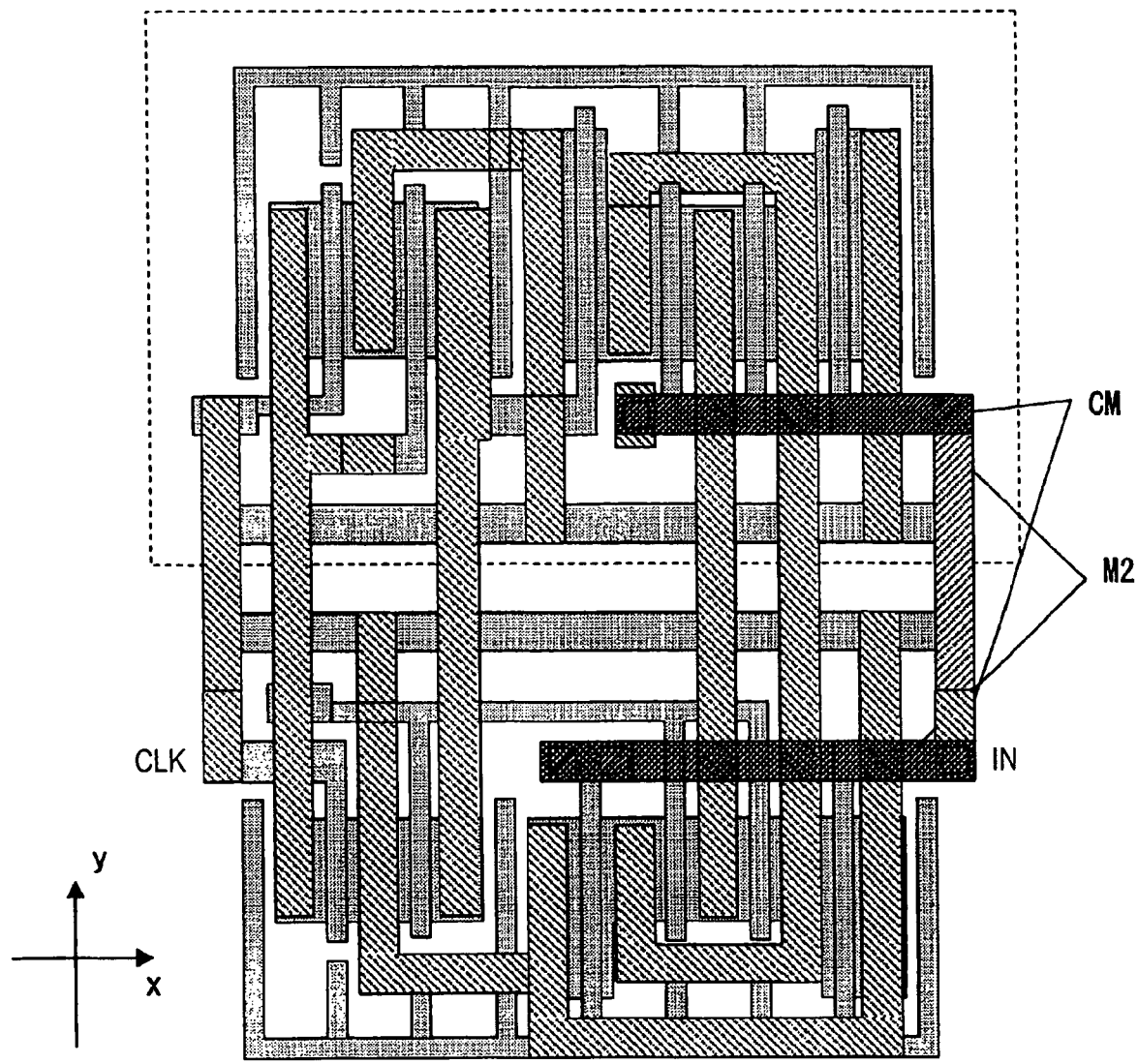
FIG. 36 is a layout of the semiconductor device in which the additional gate patterns are arranged, created by the conventional layout design method.

When FIG. 5 and FIG. 36 are compared, it is seen that lengths in the x and y directions in the figure are reduced because the gate contact region is arranged on the additional gate pattern and the spacing rule between the additional gate pattern and the gate electrode is eliminated. In addition, in FIG. 36, only one contact can be arranged in the gate contact regions CGMA 22 and 24 to 28 because of the restriction of the design rule. On the other hand, in FIG. 5, since the gate pattern with the gate electrode extended to the outside of the active region and the gate contact region CGMA2 are connected and the gate electrode and the additional gate pattern are connected, it is possible to arrange two contacts without increasing an area. In addition, since it is possible to connect a signal line with one layer of metal, signal wiring in two-layer metal is not affected. Thus, it is possible to prevent an increase in an area due to a wiring restriction in the two-layer metal.

In this way, according to the layout design method in the first embodiment of the invention, the transistor is arranged, the additional gate pattern with the same shape as the gate electrodes arranged at both the ends in the gate length direction of the transistor is automatically formed or the gate electrodes are automatically extended to the outside of the active region in a form of including adjacent gate electrodes in the gate width direction, and the gate pattern or the gate contact region connecting with the gate electrodes and the additional gate pattern is automatically connected according to an arrangement position between the gate pattern or the gate contact region and the additional gate pattern. Thus, it is possible to reduce a design man-hour of the semiconductor device in which the additional gate pattern is arranged. Moreover, since the gate electrodes and the additional gate pattern are connected, it is possible to perform layout design with an area reduced.

It is possible to implement the additional gate pattern forming step and the gate pattern connecting step described in the invention by developing a program for the function of performing conditional branch from arrangement information of the gate electrode of the transistor, the contact region connecting with the gate electrode, and the pattern of the gate electrode and the additional gate pattern using a logical arithmetic operation or a function of holding arrangement information of the additional gate pattern and the gate contact region as a part of shapes of formed transistors and conditionally branching presence or absence of connection from a positional relation between the shapes.

Note that in this embodiment, in the additional gate pattern forming step S200, when gate widths of adjacent gate electrodes on an identical transistor are different, projected parts of the adjacent gate electrodes are extended to the outside of active regions so as to range regions on the active regions of the gate electrodes in the gate width direction. However, it is needless to mention that the same processing is also executed when the position of both ends in the gate width direction of the active regions of the adjacent gate electrodes are different even if gate widths are the same.

In this embodiment, in the additional gate pattern forming step S200, when gate widths of adjacent gate electrodes on an identical transistor are different, projected parts of the adjacent gate electrode are extended to the outside of active regions so as to range regions on the active regions of the gate electrodes. However, an additional gate pattern may be formed so as to range regions on the active regions of the adjacent gate electrodes. In this case, although a degree of freedom of layout design is deteriorated, there is an effect that a load is reduced because the gate electrodes are not extended.

Second Embodiment

Figure 12:
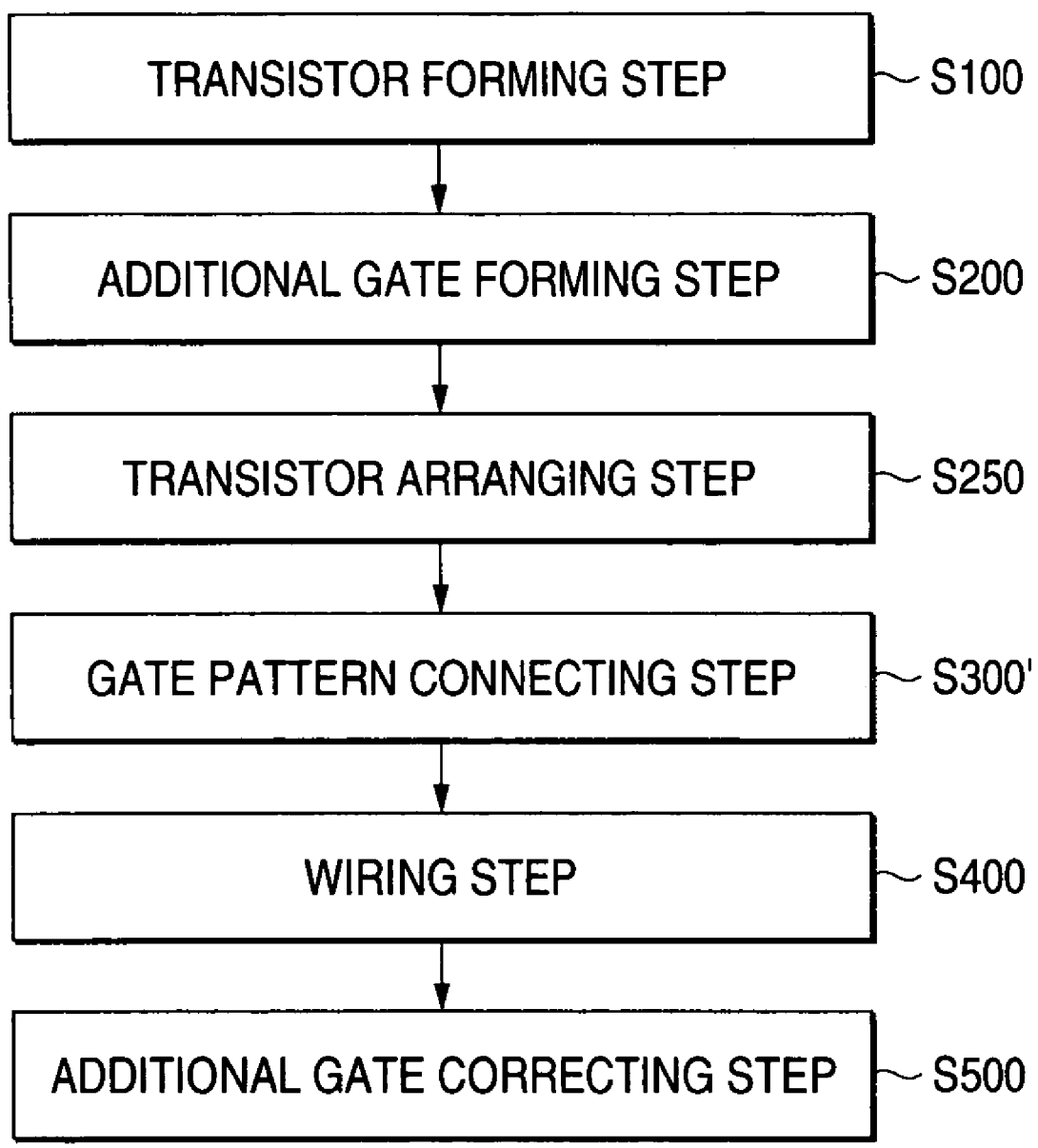
FIG. 12 is a flow diagram for explaining a layout design method for a semiconductor device in which additional gate pattern are arranged in a second embodiment.
Figure 13:
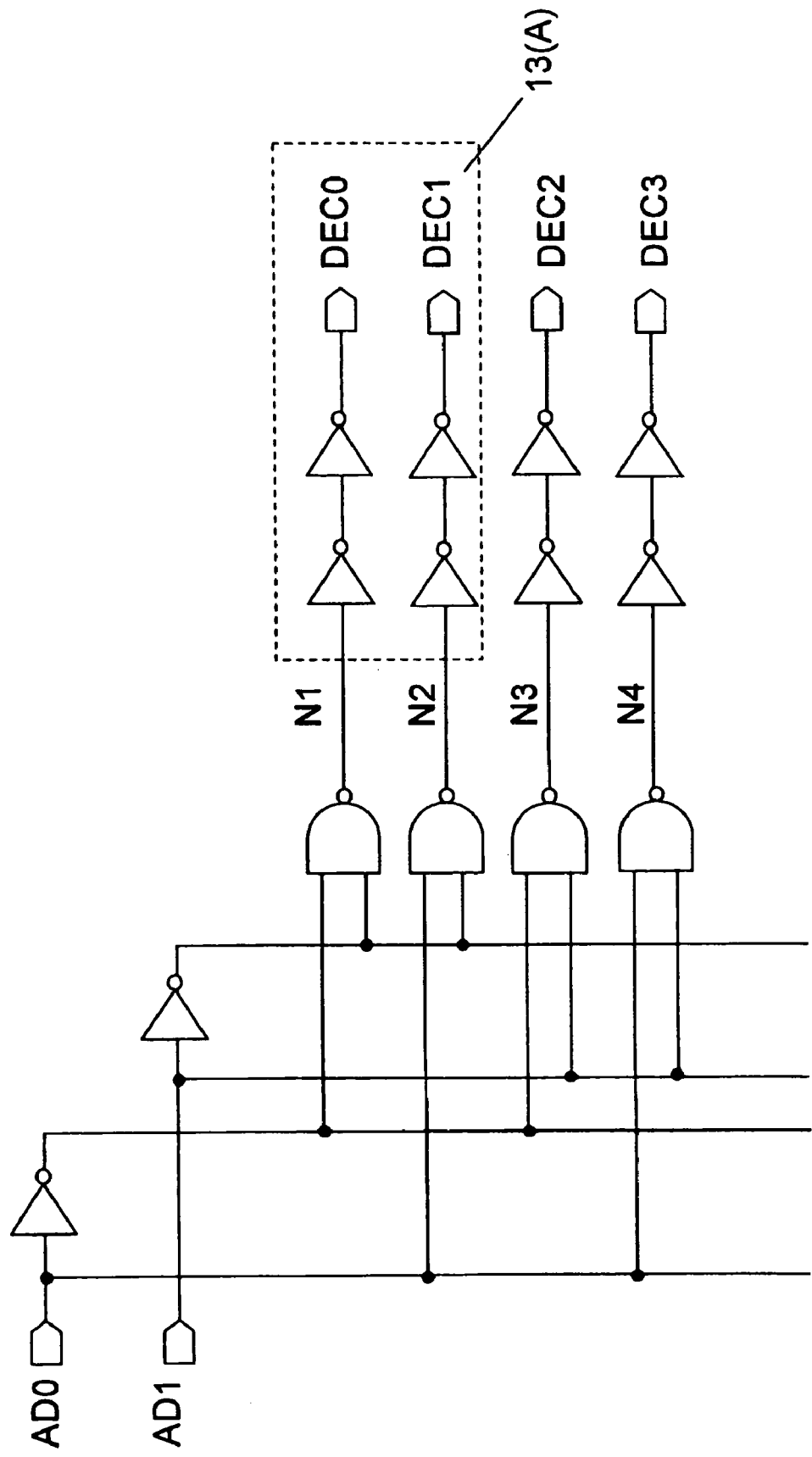
FIG. 13 is a decode circuit of a general semiconductor device.

FIG. 12 is a diagram showing a flow of a layout design method according to a second embodiment of the invention. The layout design method in the second embodiment is different from the layout design method described in the first embodiment in that a transistor moving step S250 of moving a transistor is added after the additional gate pattern forming step S200, an additional gate pattern correcting step S500 of correcting a shape or adding an additional gate pattern anew such that the additional gate pattern arranged as the dummy gate meets the design rule is added after the wiring step S400, and a gate pattern connecting step S300' is a partially corrected version of the gate pattern connecting step S300 in the first embodiment. The layout design method in this embodiment will be hereinafter explained centering on the steps changed from the first embodiment with layout design of a buffer section 13(A) of a decoder circuit shown in FIG. 13 as an example.

Figure 14:
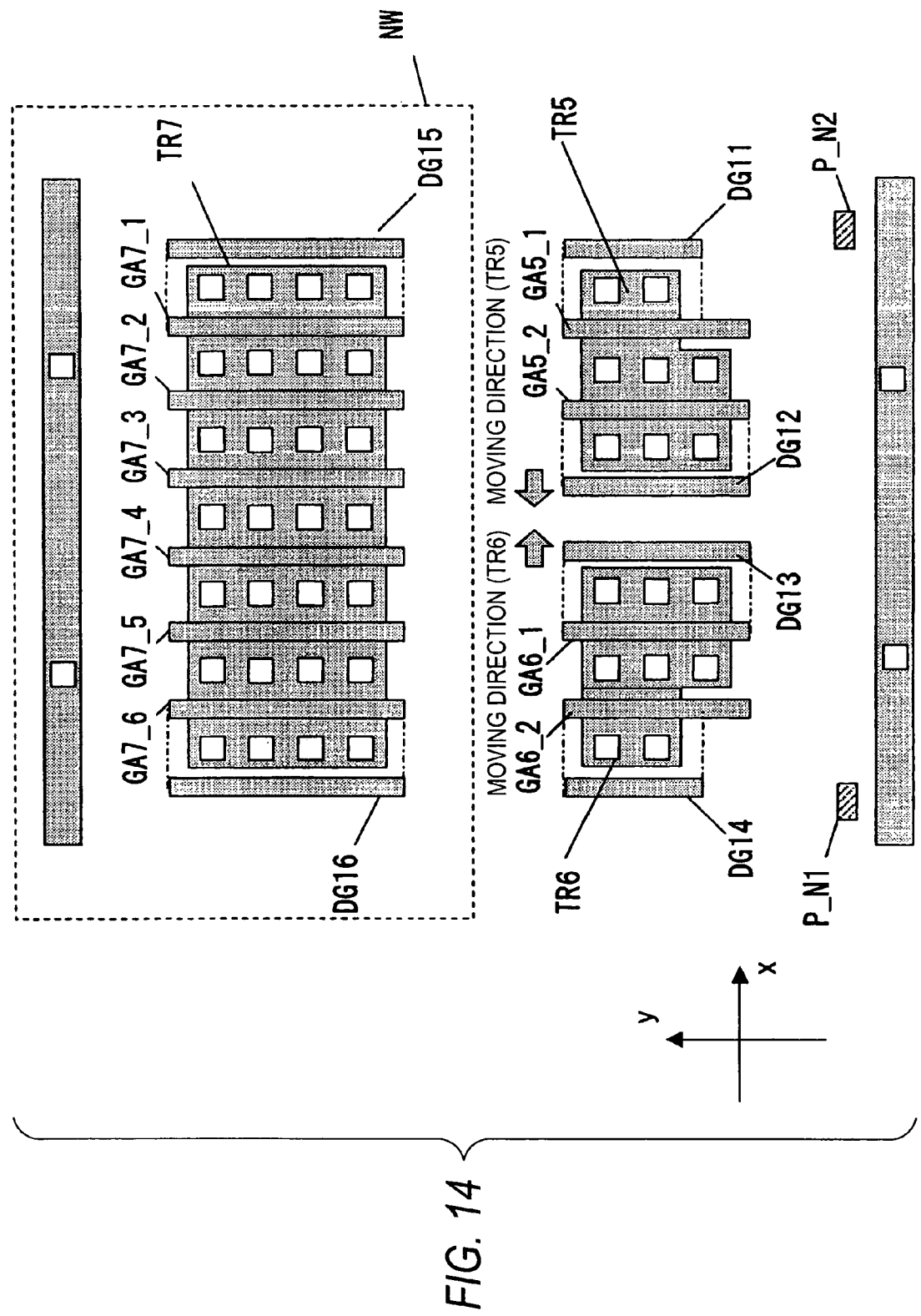
FIG. 14 is a layout of a semiconductor device, in which additional gate patterns are arranged, designed by the layout design method in the second embodiment.

FIG. 14 is a layout diagram in which transistors TR5 to TR7 are formed in the transistor forming step S100 and, then, additional gate patterns DG11 to 16 serving as dummy gate are formed in the additional gate pattern forming step S200. As indicated by an alternate long and short dash line, the additional gate patterns DG11 to 16 are formed in a size including regions on active regions of gate electrodes on both ends in a gate length direction of the transistor TR5 to 7 and lengths of projections. P_N1 and P_N2 are input pins. It is considered desirable to move TR5 and TR6 in a direction shown in the figure because of arrangement positions of the input pins and a spacing rule of metal.

FIG. 15 is a diagram in which the transistors TR5 and TR6 are moved in the transistor moving step S250. The transistor moving step S250 is a step of moving transistors and additional gate patterns arranged at a fixed distance from gate electrodes of the transistors while maintaining a positional relation. Even if the transistors TR5 and TR6 are moved in −x and +x directions in the figure, respectively, the positional relation between the transistors TR5 and TR6 and the additional gate patterns DG11 and 12 as well as DG13 and DG14 are maintained.

When one additional gate pattern arranged as dummy gate are arranged in a form of including range of gate electrodes of two transistors, which are arranged a fixed distance apart from the additional gate pattern, in a gate width direction, in the transistor moving step S250, the transistors are moved while keeping a positional relation between the additional gate pattern of a size proportionate to the gate electrode of the respective transistors and the transistors.

Figure 16:
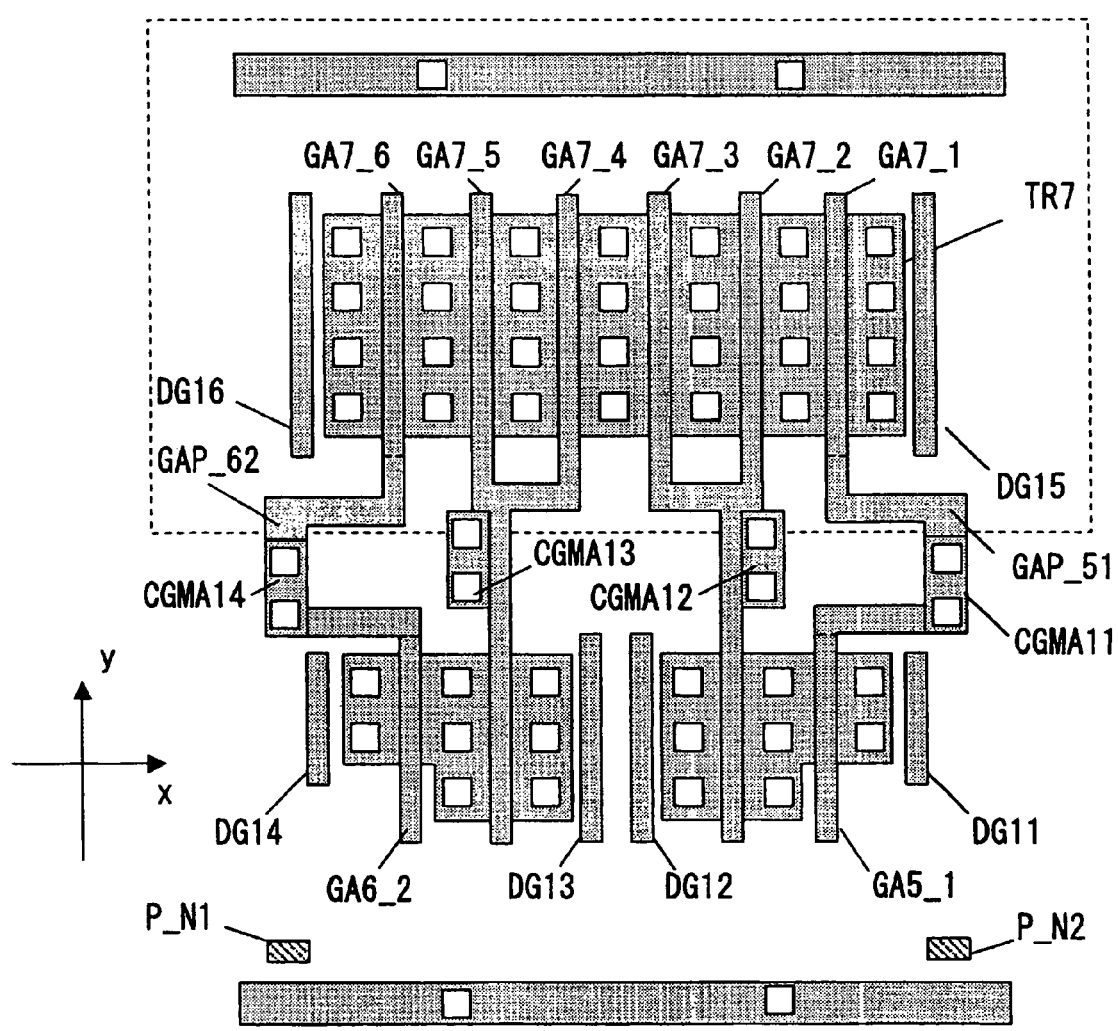
FIG. 16 is a layout of the semiconductor device in which the additional gate patterns are arranged, designed by the layout design method in the second embodiment.

FIG. 16 is a diagram in which gate electrodes, additional gate patterns, and gate contact regions are connected in the gate pattern connecting step S300'. Since input pins are arranged in a lower left and a lower right of a screen, gate electrodes GA5_1 and GA7_1 as well as GA6_2 and GA7_8 are connected by gate patterns GA_51 and GA_62 and gate contact regions CGMA11 and CGMA14 and arranged in a place near additional gate patterns DG11 and DG14. The second embodiment is different from the first embodiment in that the additional gate patterns DG11 and DG14 recognizes a distance from gate contact regions and automatically deletes sections opposed to projected parts from active regions of gate electrodes of transistors.

Figure 19:
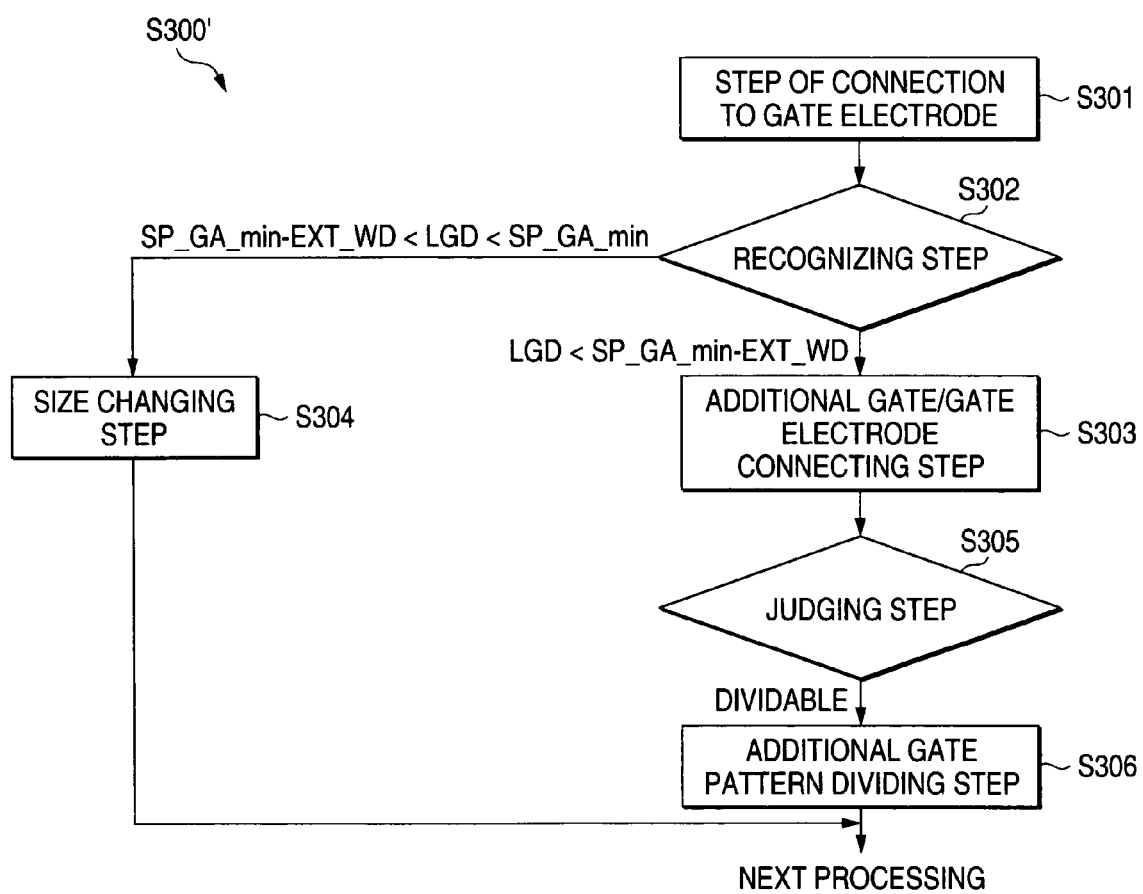
FIG. 19 is a flow diagram for explaining a gate pattern connecting step S300' in the second embodiment.

FIG. 19 is a diagram showing processing in the gate pattern connecting step 300'. The gate pattern connecting step S300' is different from the gate pattern connecting step S300 in the first embodiment in that, a size changing step S304 of deleting the projected parts of the additional gate patterns arranged as the dummy gate when the relation between the interval LGD between gate patterns and the length EXT_GD of the projected part from the active regions of the gate electrodes and the minimum spacing rule SP_GA_min between the gate patterns meet the condition of SP_GA_min-EXT_GD<LGD<SP_GA_min in the recognizing step S302, a judging step S305 of judging whether the additional gate patterns can be divided from a shape of the additional gate patterns serving as the dummy gates connected to the gate electrodes after the additional gate/gate pattern connecting step S303 executed when LGD<SP_GA_min-EXT_WD after the recognizing step S302, and an additional gate pattern dividing step S306 of dividing the additional gate patterns into two when the condition in S305 is met are added.

Figure 20:
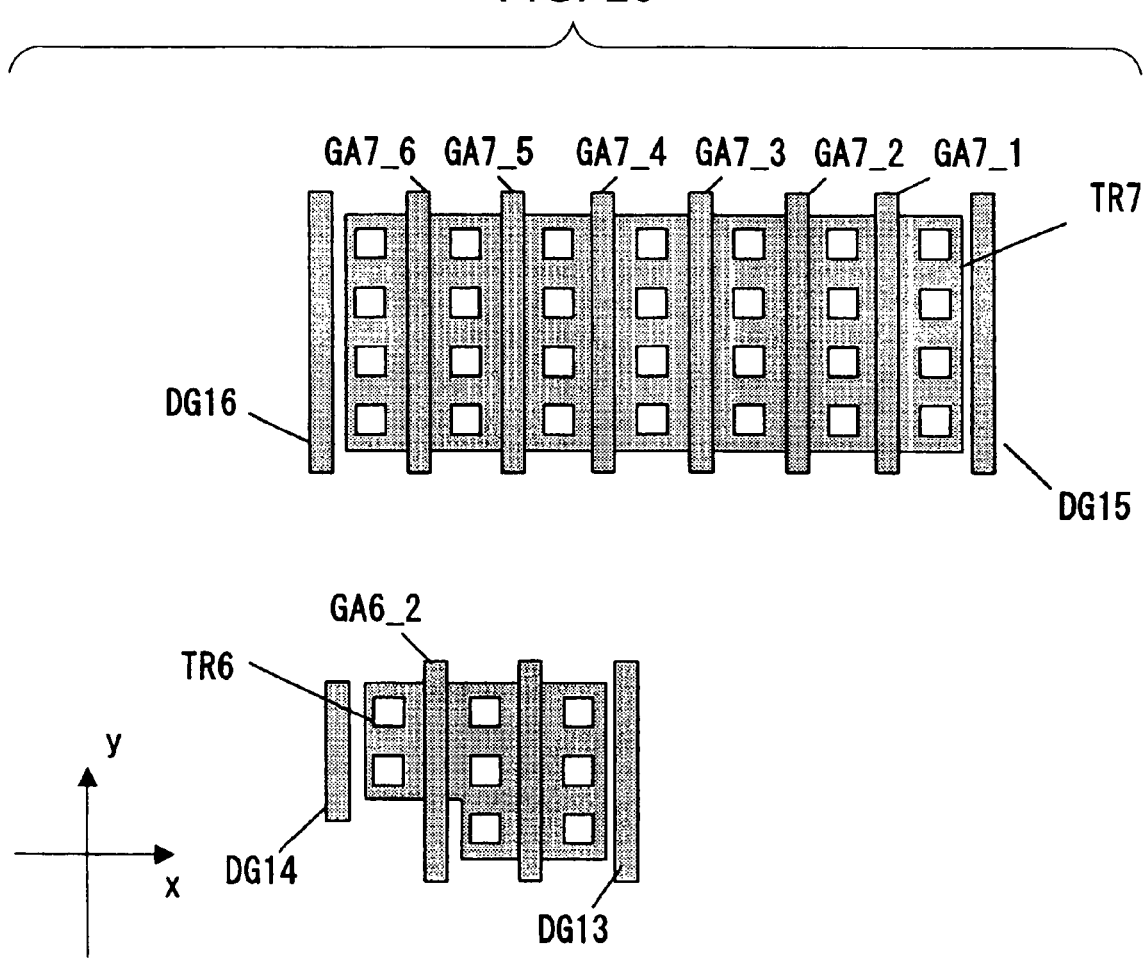
FIG. 20 is a layout diagram of a semiconductor device in which additional gate patterns are arranged for explaining the gate pattern connecting step S300' in the second embodiment.

In FIGS. 20 to 26, the processing in the gate pattern connecting step S300' is explained centering on added parts. In FIG. 20, the transistors TR6 and TR7 and a part of the additional gate patterns are excerpted from FIG. 15.

Figure 21:
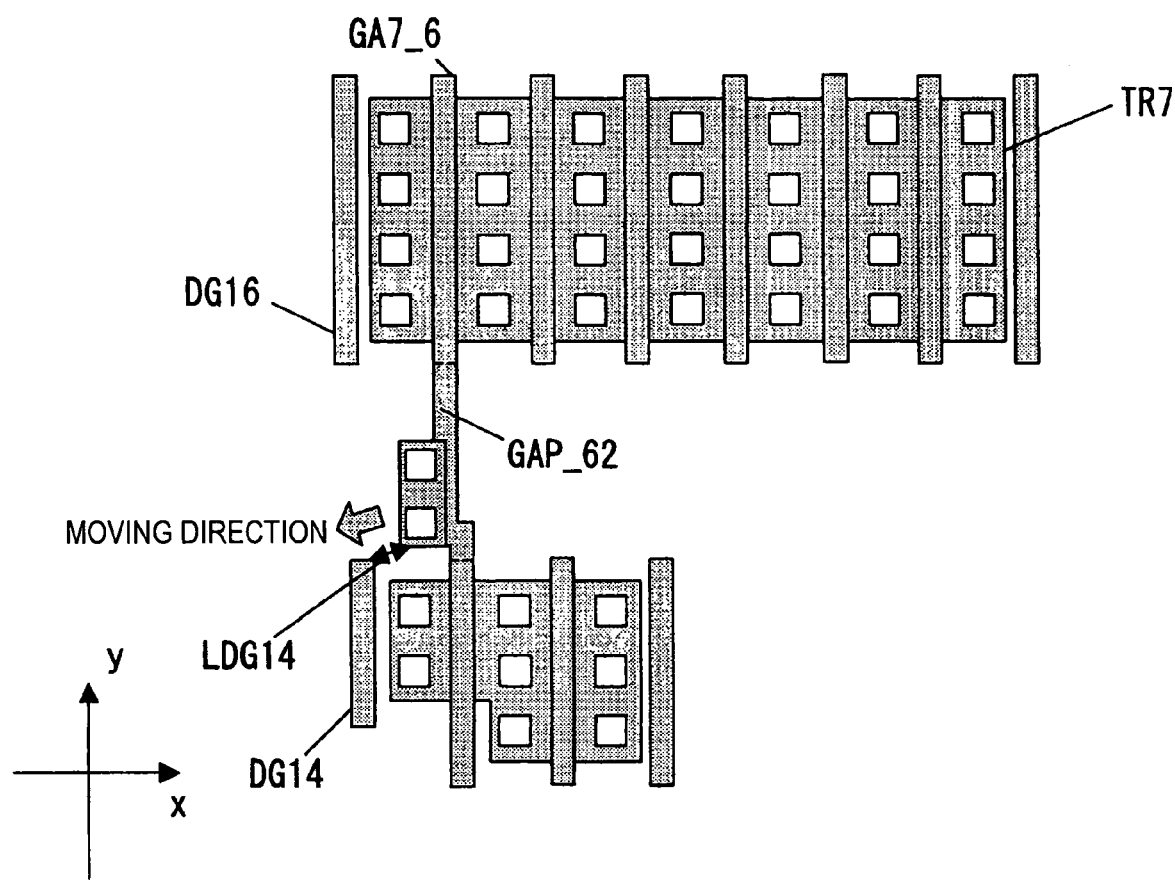
FIG. 21 is a layout diagram of the semiconductor device in which the additional gate patterns are arranged for explaining the gate pattern connecting step S300' in the second embodiment.

First, the gate electrodes GA6_2 and GA7_6 are connected by a gate pattern GAP_62. Since an input pin is in a lower left in the figure and an output node is on a right side in a screen, a gate contact region CGMA14 is arranged on GAP 62 and is moved around additional gate pattern DG14 serving as a dummy gate is moved to around DG14 (FIG. 21).

Figure 22:
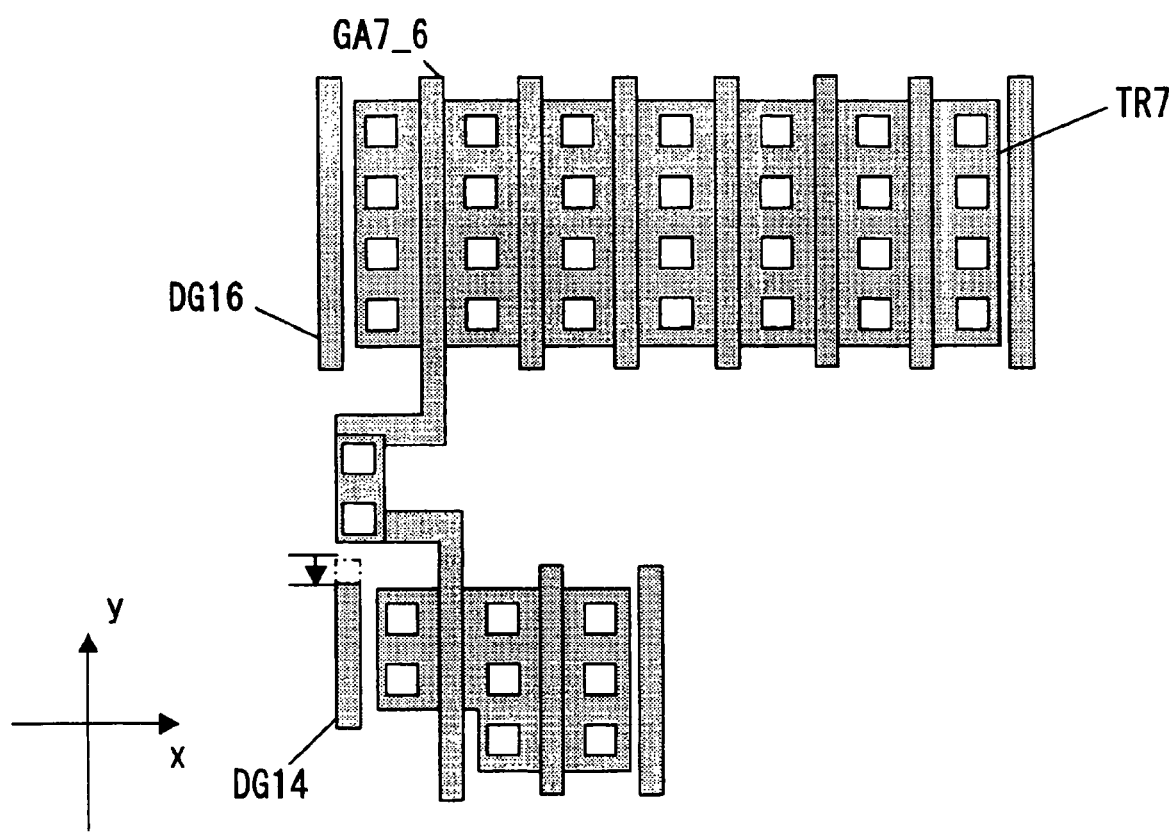
FIG. 22 is a layout diagram of the semiconductor device in which the additional gate patterns are arranged for explaining the gate pattern connecting step S300' in the second embodiment.

When a distance LdG_14 between the additional gate pattern DG14 and the gate contact region CGMA14 is in a relation of SP_GA_min-EXT_GD<LDG14<SP_GA_min, the dummy gate size changing step S304 is executed from the conditional branch in the recognizing step in S302 to change a length of the additional gate pattern DG14 until an upper end in a y direction of an active region of the gate electrode GA6_2, that is, deleting the part of gate pattern DG14 opposed to a projected part from the active region of gate electrode GA6_2 (FIG. 22).

Figure 17:
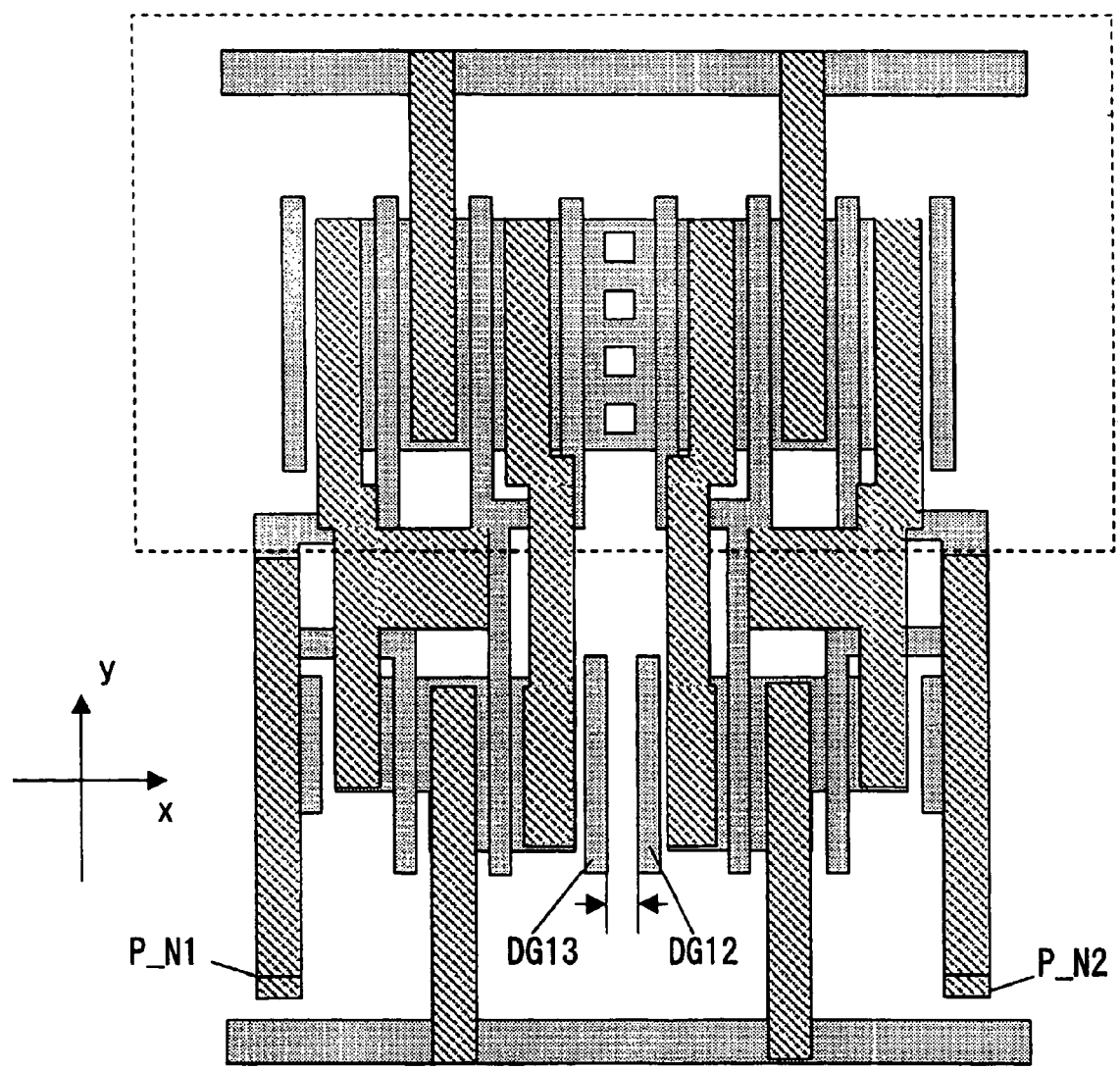
FIG. 17 is a layout of the semiconductor device in which the additional gate patterns are arranged, designed by the layout design method in the second embodiment.

As opposed to FIG. 16, FIG. 17 is a diagram in which wiring is made by one-layer metal in the wiring step S400. Note that it is assumed that power supply wiring is made by not-shown two-layer metal. After this wiring ends, if a design rule is not met between additional gate patterns arranged as dummy gates and both the additional gate patterns are in floating or a power supply or ground potential, the additional gate pattern correcting step S500 of correcting and adding an additional gate pattern is executed. In FIG. 17, since additional gate patterns DG12 and DG13 do not meet the spacing rule SP_GA_min, in the additional gate pattern correcting step S500, formation of a new additional gate pattern filling a space between DG12 and DG13 or size change of the additional gate patterns DG12 and DG13 is executed.

Figure 18:
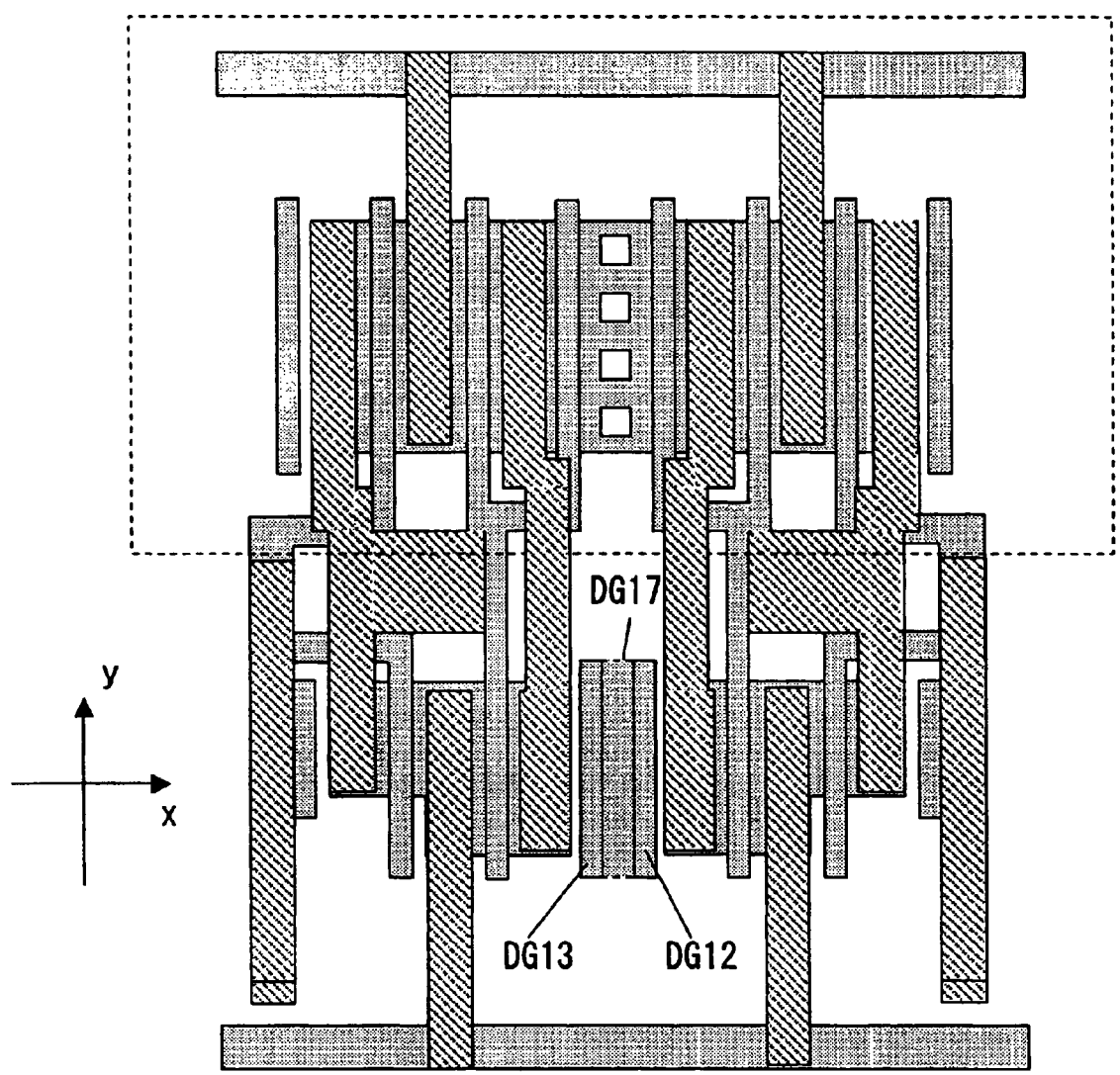
FIG. 18 is a layout of the semiconductor device in which the additional gate patterns are arranged, designed by the layout design method in the second embodiment.

FIG. 18 is a diagram in which the additional gate pattern correcting step S500 is executed from FIG. 17. An additional gate pattern DG17 is formed anew to avoid a violation of a spacing rule between the additional gate patterns DG12 and DG13.

Figure 23:
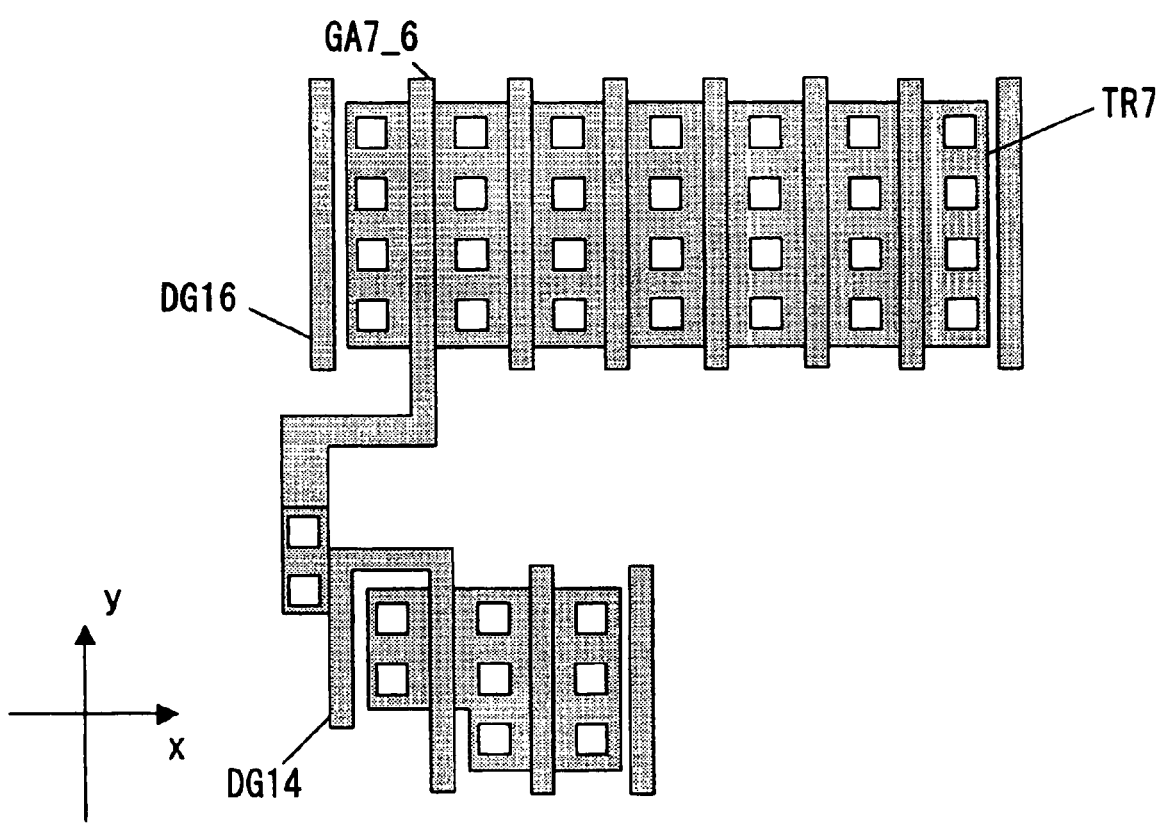
FIG. 23 is a layout diagram of the semiconductor device in which the additional gate patterns are arranged for explaining the gate pattern connecting step S300' in the second embodiment.
Figure 24:
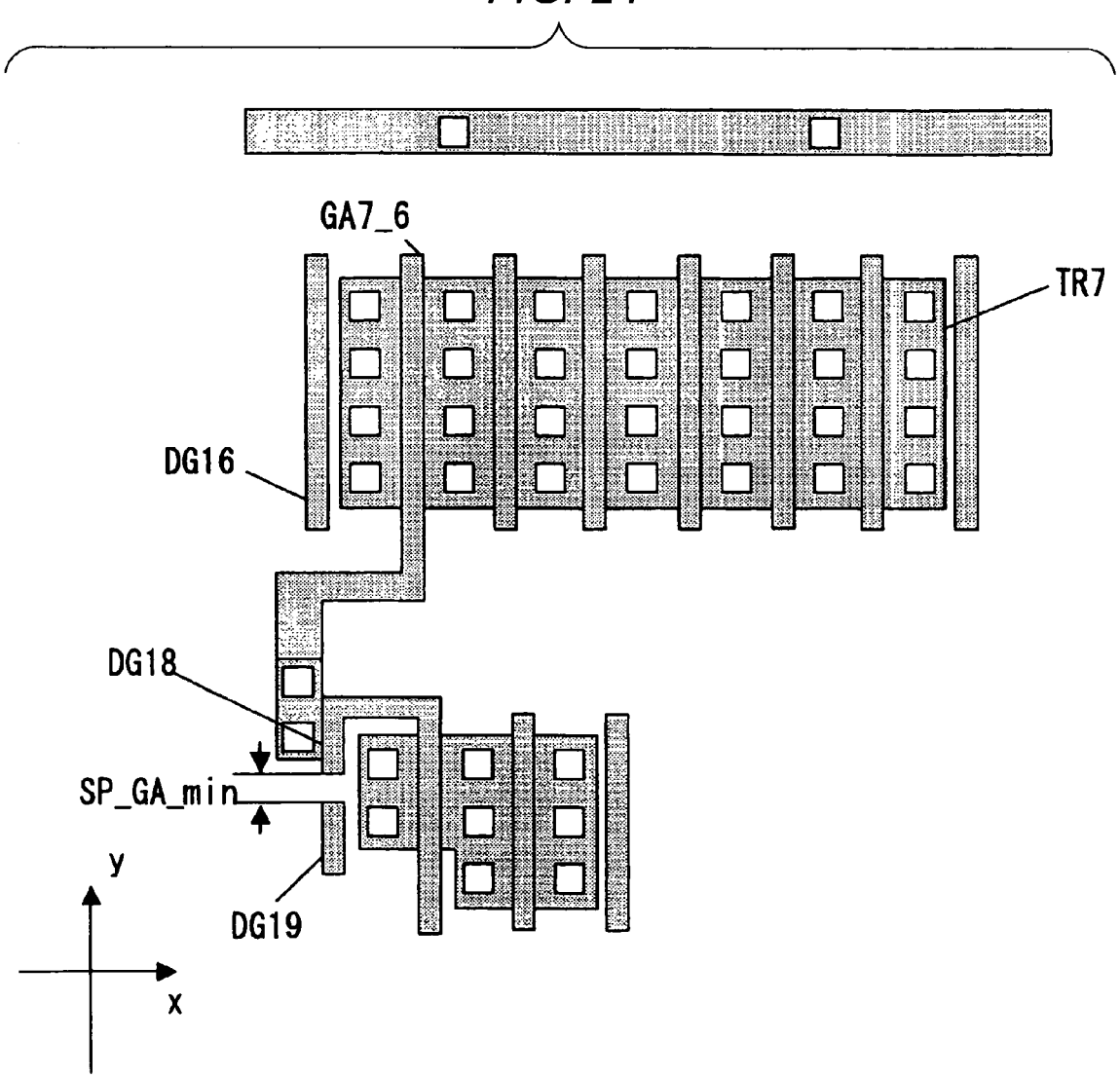
FIG. 24 is a layout diagram of the semiconductor device in which the additional gate patterns are arranged for explaining the gate pattern connecting step S300' in the second embodiment.

In order to give a supplementary explanation about the gate pattern connecting step, a case in which the gate contact region CGMA14 is brought closer to the additional gate pattern DG14 will be explained. When the distance LDG14 between the gate contact region CGMA14 and the additional gate pattern DG4 meet the condition LDG14<SP_GA_min-EXT_WD, the additional gate/gate pattern connecting step S303 is executed from the result of the conditional branch in the recognizing step S302 and the gate contact region CGMA14 and the additional gate pattern DG14 are connected (FIG. 23). Next, in the judging step S305, it is judged whether it is possible to divide the connected additional gate pattern. As a judgment condition, for example, a length in y direction of an additional gate pattern arranged at a width in x direction LG_min from an end is longer than a sum of a minimum line length WG_min calculated from a minimum area and a minimum width of a gate pattern and a gate pattern minimum interval SP_GA_min. When this condition is met, the additional gate pattern dividing step S306 is executed, and the additional gate pattern DG14 is divided into an additional gate pattern DG18 connecting with a gate electrode and an additional gate pattern DG19 that does not connect with the gate electrode and is floating in terms of a potential while complying with the spacing rule SP_GA_min (FIG. 24).

In this way, according to the layout design method in the second embodiment of the invention, a length of an additional gate pattern is changed or connected to a gate electrode or divided according to an arrangement condition between an additional gate pattern connecting with a gate electrode, a gate contact region, and an additional gate pattern arranged as a dummy gate. When the additional gate patters do not meet a design rule, a shape of the additional gate patterns is corrected or an additional gate pattern is arranged anew to meet the design rule automatically, whereby a designer can perform layout design without being conscious of a design rule concerning the additional gate pattern arranged as the dummy gate. Thus, it is possible to reduce a layout design man-hour for a semiconductor device. Moreover, since the additional gate pattern connecting with the gate electrode is divided automatically, in particular, when the gate electrode is connected to an additional gate pattern adjacent to a transistor with a large gate width, it is possible to perform layout design with a reduced load in a less man-hour.

Note that in order to perform layout design with a reduced load through connection with an additional gate pattern, it is desirable to select an additional gate pattern with a smaller area among additional gate patterns arranged at a fixed distance from a gate electrode of a transistor.

In this embodiment, the additional gate pattern DG17 with a size in the gate width direction equal to that of the additional gate patterns DG12 and DG13 is formed in the additional gate pattern correcting step. However, when lengths of additional gate patterns violating a design rule are different or when arrangement position in the gate width direction (the y direction in the figure) are different, only sections violating the design rule are corrected.

Figure 25:
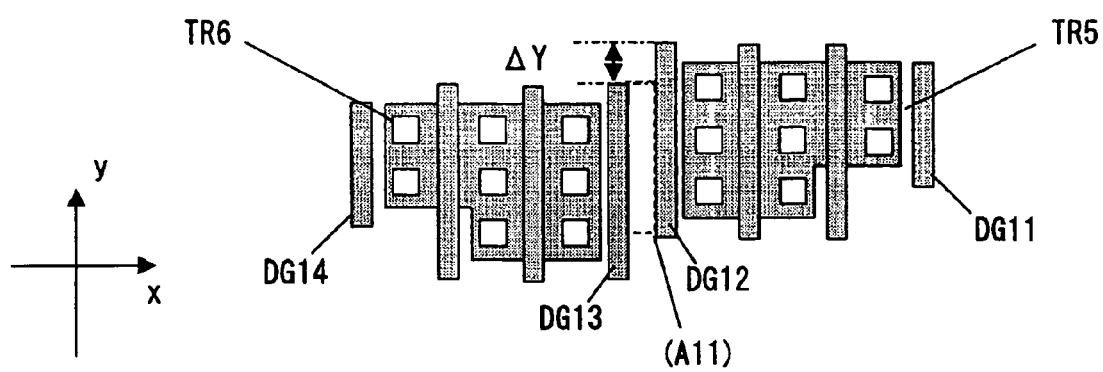
FIG. 25 is a layout diagram of the semiconductor device in which the additional gate patterns are arranged for explaining the gate pattern correcting step S500' in the second embodiment.

In FIG. 25, only the transistors TR5 and 6 are excerpted from FIG. 14. FIG. 25 is different from FIG. 14 in that an arrangement relation of TR5 and Tr6 is deviated by ΔY in the y direction in the figure.

Figure 26:
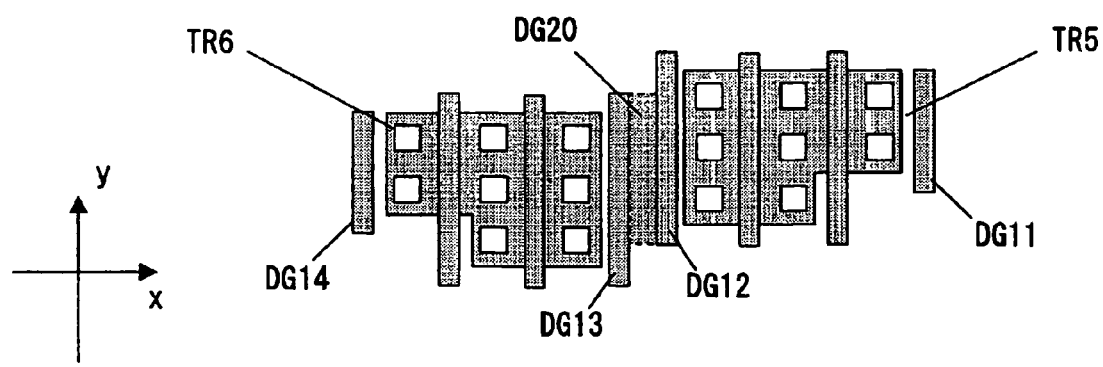
FIG. 26 is a layout diagram of the semiconductor device in which the additional gate patterns are arranged for explaining the gate pattern correcting s500' in the second embodiment.

As opposed to FIG. 25, in FIG. 26, the additional gate pattern correcting step S500 is executed. In this additional gate pattern correcting step, an additional gate pattern DG20 is formed anew for a range of (A11), in which design rule error actually occurs, in order to avoid the design rule. By carrying out a minimum change in order to avoid the design rule in this way, it is possible to avoid violation of the design rule in the correcting step without affecting other additional gate patterns used for connection with the gate electrode or the like.

Note that, in this embodiment, in the additional gate pattern correcting step S500, violation of the design rule is avoided by forming an additional gate pattern anew. However, an avoidance method for changing a shape of an additional gate pattern to meet a design rule may be used. Moreover, in this embodiment, the additional gate pattern correcting step is performed after creating a unit cell. However, the additional gate pattern correcting step S500 may be performed in a higher order design hierarchy, in which plural unit cells are arranged, in order to meet a design rule between additional gate patterns arranged in the unit cells.

In FIG. 24, a transistor is not shown in the –x direction of TR6. However, it is needless to mention that, when a transistor TR6' is present in the –x direction of TR6 and an additional gate pattern serving as a dummy gate of TR6' is present on a line identical with that of DG14 or when the additional gate pattern and DG14 do not meet a separation rule between gate patterns and are formed as identical additional gate patterns, the additional gate pattern DG19 cut for a reduction of a load and the additional gate pattern DG18 connecting with the gate electrode GA6_2 are formed to be arranged over both ends in the gate width direction of gate electrodes of both TR6 and TR6', whereby the two gate patterns has an effect of controlling fluctuation in shapes for the gate electrodes of the two transistors.

Third Embodiment

Figure 27:
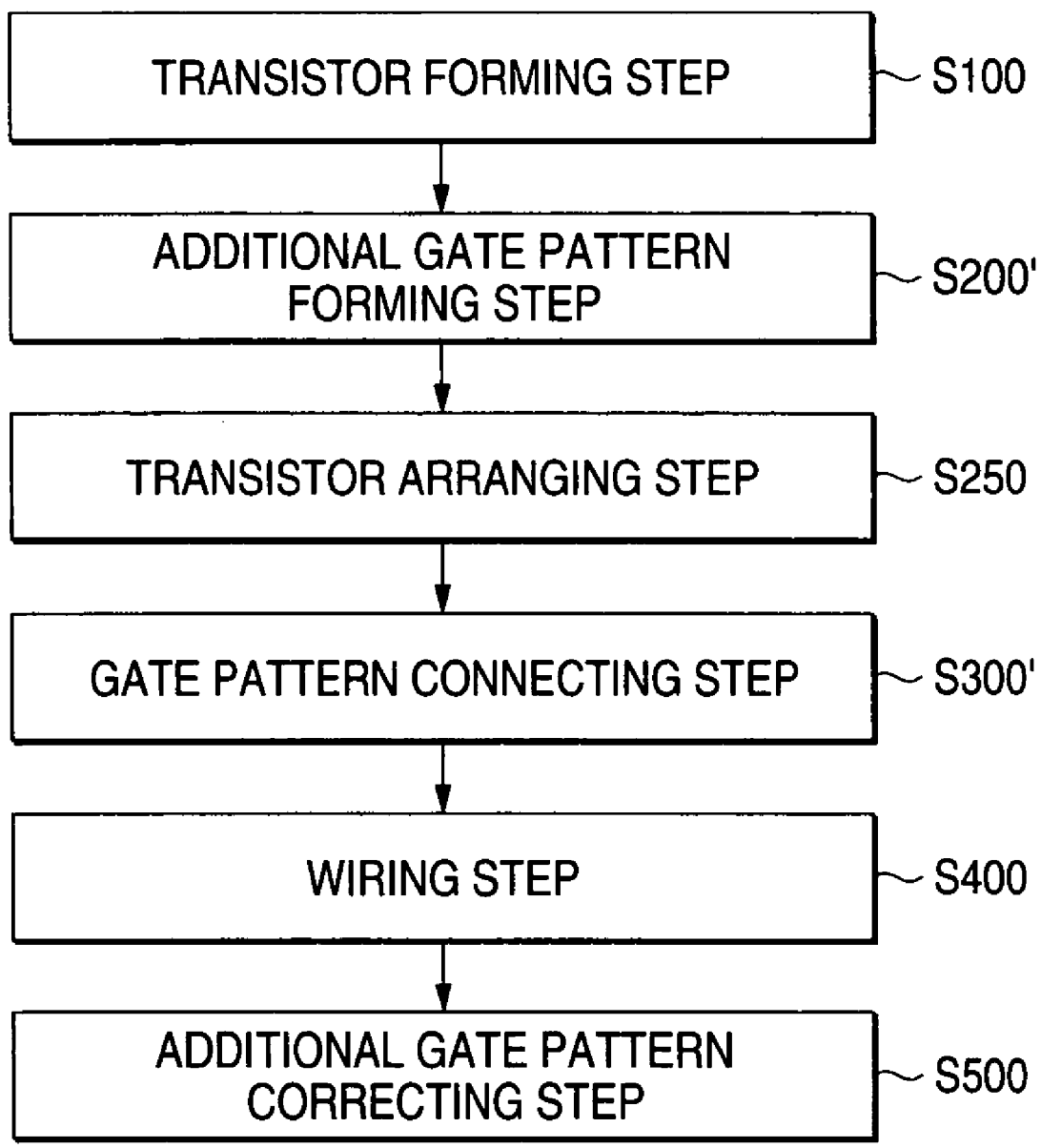
FIG. 27 is a flow diagram for explaining a layout design method for a semiconductor device in which additional gate patterns are arranged in a third embodiment.

FIG. 27 is a diagram showing a flow of a layout design method according to a third embodiment of the invention. The layout design method in the third embodiment is different from the layout design method described in the second embodiment in that an additional gate pattern forming step S200' is a partially corrected version of the additional gate pattern forming step S200' in the second embodiment. The layout design method in this embodiment will be hereinafter explained concerning only changed steps.

Figure 28:
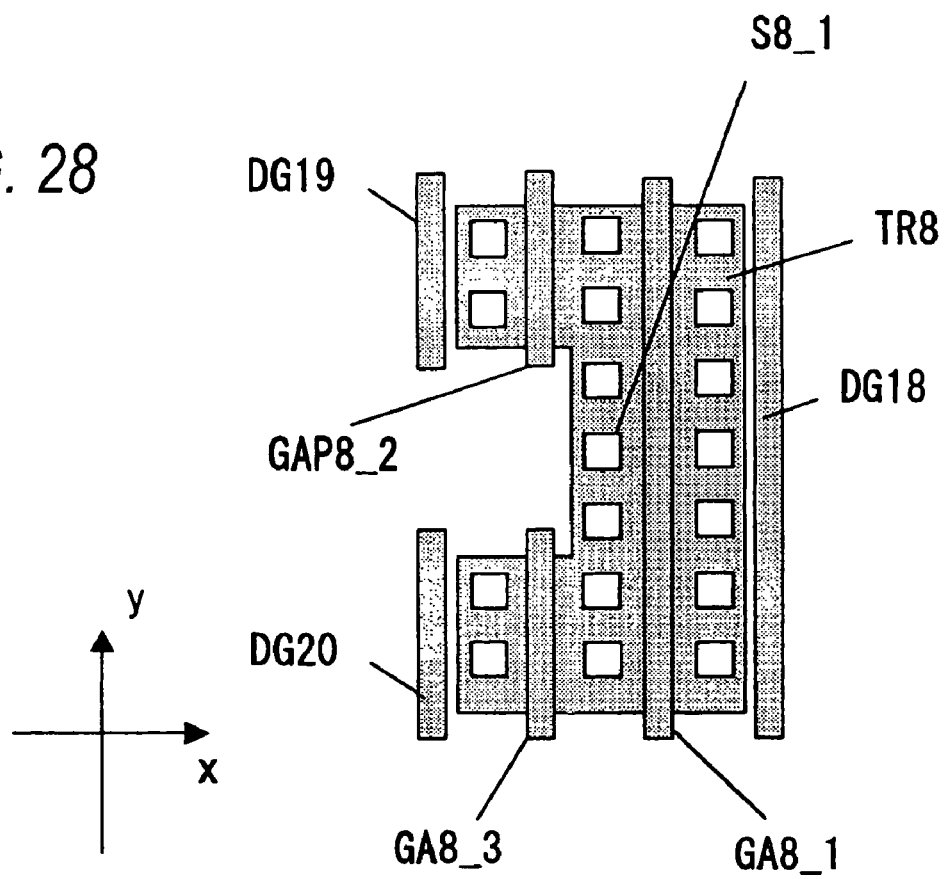
FIG. 28 is a layout of a semiconductor device in which additional gate patterns are arranged, designed by the layout design method in the third embodiment.

FIG. 28 is a layout diagram in which a transistor TR8 is formed in the transistor forming step S100. Gate electrodes GA8_1 to 3 are arranged on the transistor TR8 and the gate electrodes GA8_2 and GA8_3 are arranged linearly and share a source region S8_1.

Figure 30:
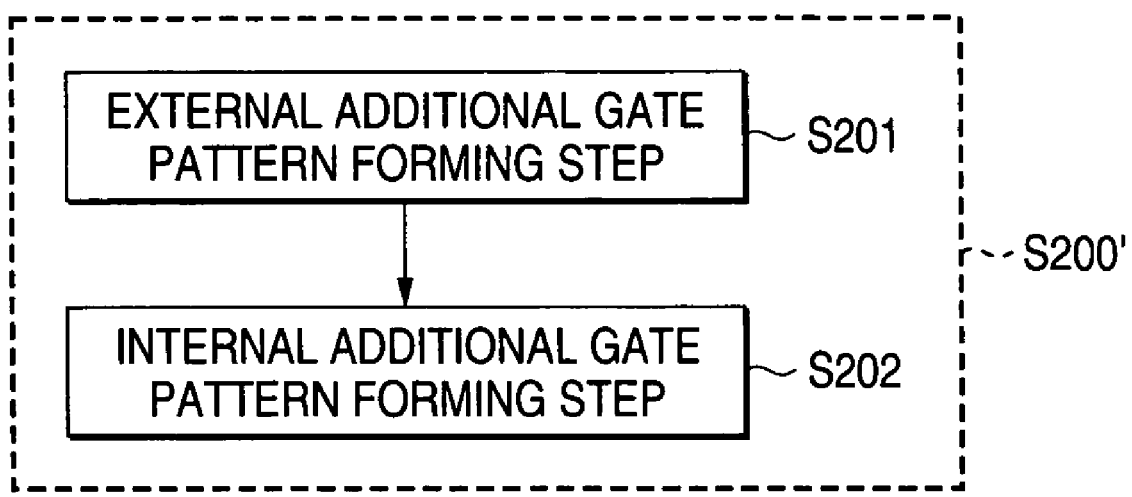
FIG. 30 is a flow diagram for explaining an additional gate pattern forming step S200' in the third embodiment.
Figure 31:
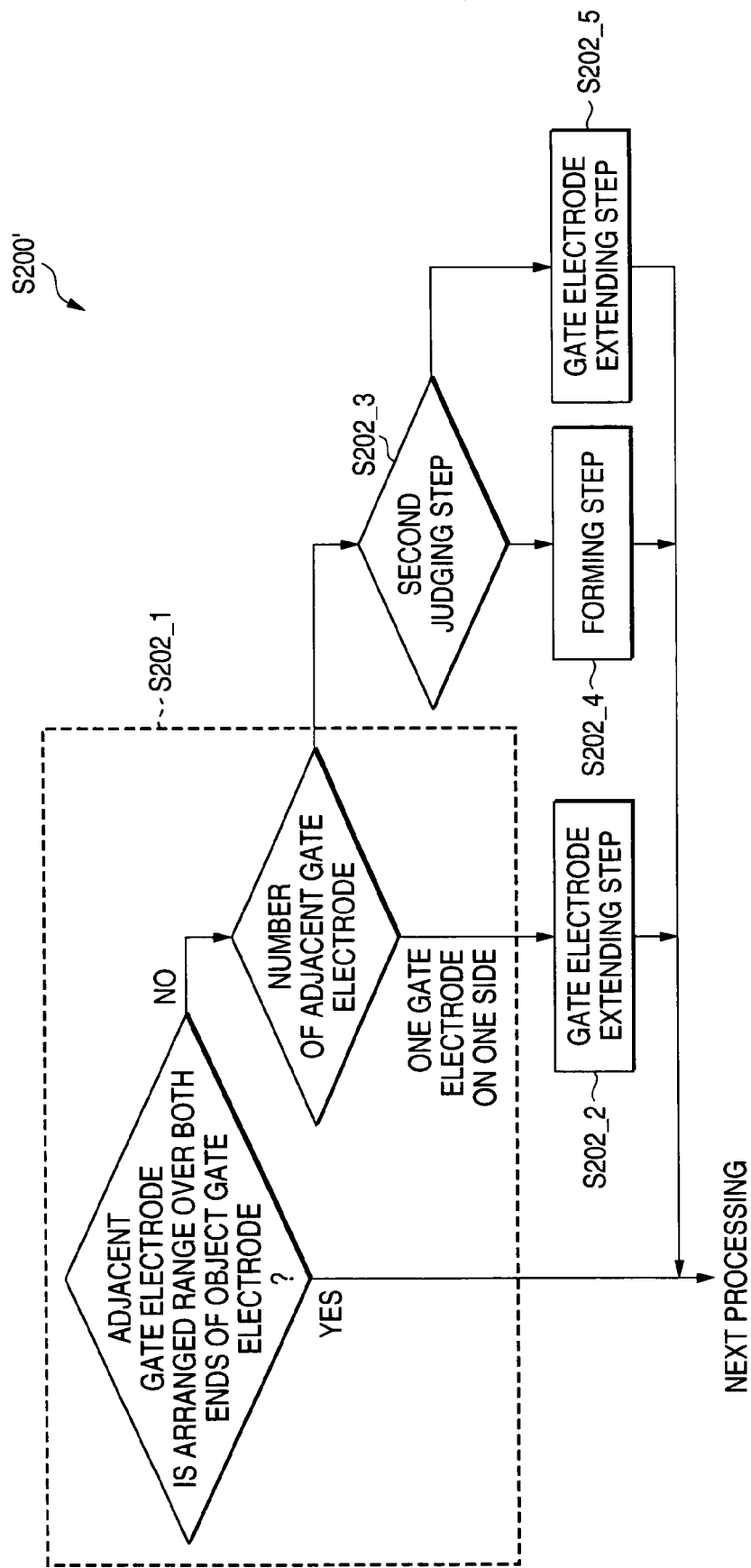
FIG. 31 is a flow diagram for explaining an internal additional gate pattern forming step S202 in the third embodiment.

FIG. 30 is a diagram showing a flow of the additional gate pattern forming step S200'. The additional gate pattern forming step S200' consists of an external additional gate pattern forming step S201 of arranging an additional gate pattern serving as a dummy gate at a fixed distance from gate electrodes at both ends in a gate length direction of a transistor and an internal additional gate pattern forming step S202 of, when gate electrodes adjacent to an object gate electrode are not arranged in an area over both ends in a gate width direction of the object gate electrode for all the gate electrodes of the transistor, extending the gate electrodes or forming an additional gate pattern. FIG. 31 is a diagram showing a flow of the internal additional gate pattern forming step S202. The internal additional gate pattern forming step S202 consists of a judging step S202_1 of judging whether an adjacent gate electrode on one side and a projected part thereof are arranged in an entire area over both ends in the gate width direction of the gate electrodes for all the gate electrodes, a gate electrode extending step S202_2 of, when adjacent gate electrode and the projected part thereof are not arranged in a entire region on both ends in gate width direction of the gate electrode, if the gate electrode on one side is one gate electrode, extending an adjacent gate electrode as it is, a second judging step S202_3 of performing conditional branch concerning whether there are two adjacent gate electrodes on one side and an interval in the gate width direction is larger than a sum of a space two times as large as that in a minimum spacing rule between gate patterns and a minimum gate line length WG_min determined from a minimum area, a forming step S202_4 of forming an additional gate pattern as a dummy gate between the two gate electrode when the condition is met, and a step S202_5 of extending adjacent gate electrodes to the outside of active regions when the condition is not met.

Figure 29:
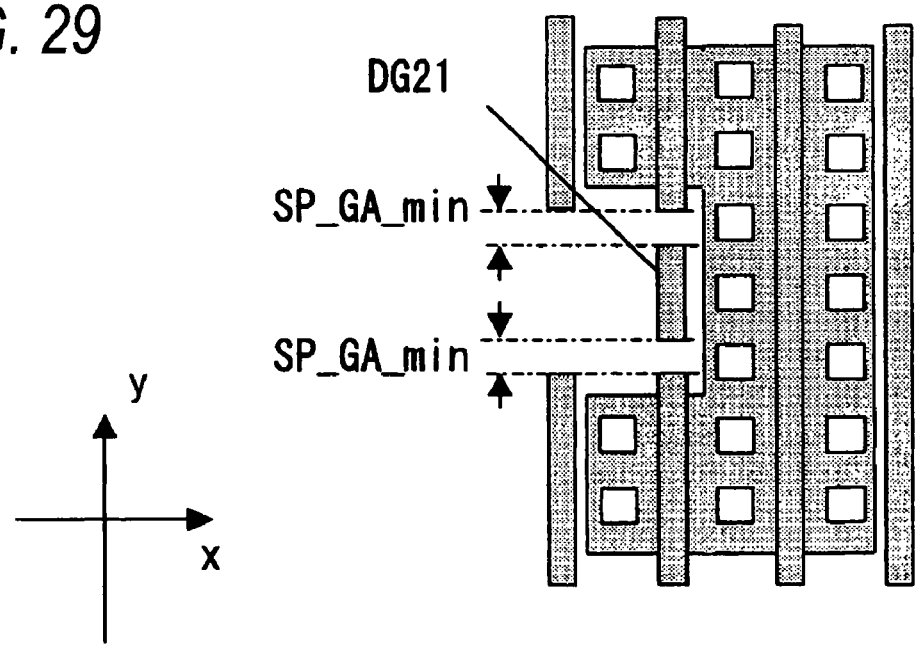
FIG. 29 is a layout of the semiconductor device in which the additional gate patterns are arranged, designed by the layout design method in the third embodiment.

FIGS. 28 and 29 are diagrams showing a layout in which additional gate patterns are arranged in the additional gate pattern forming step S200'. First, the external additional gate pattern forming step S201 is executed and additional gate patterns DG18 to 20 are formed at a fixed distance from gate electrodes GA8_1 to 3 on a transistor TR8 so as to include areas on active regions of the gate electrodes GA8_1 to 3 and projected parts in a gate width direction (FIG. 28). Next, since the region of the gate electrodes GA8_2 and GA8_3, and the projected parts thereof in the gate width direction are not arranged in an entire region over both ends in the gate width direction of the gate electrode GA8_1 and an interval between the gate electrodes GA8_2 and GA8_3 meet the condition, in the internal additional gate pattern forming step, a gate pattern DG21 is arranged in a form of meeting the minimum spacing rule SP_GA_min on an extended line of GA8_2 and GA8_3 (FIG. 29). If the interval between GA8_2 and GA8_3 does not meet the condition, processing for extending the gate electrode GA8_2 and GA8_3 is executed.

In this way, according to the layout design method in the third embodiment of the invention, even when source and drain transistor are adjacent to two or more gate electrodes according to arrangement positions and a shape of gate electrodes of arranged transistors, it is possible to reduce a layout design man-hour by automatically performing formation of an additional gate pattern serving as a dummy gate between the gate electrodes or extension of the gate electrodes to the outside of the active regions.

Fourth Embodiment

Figure 32:
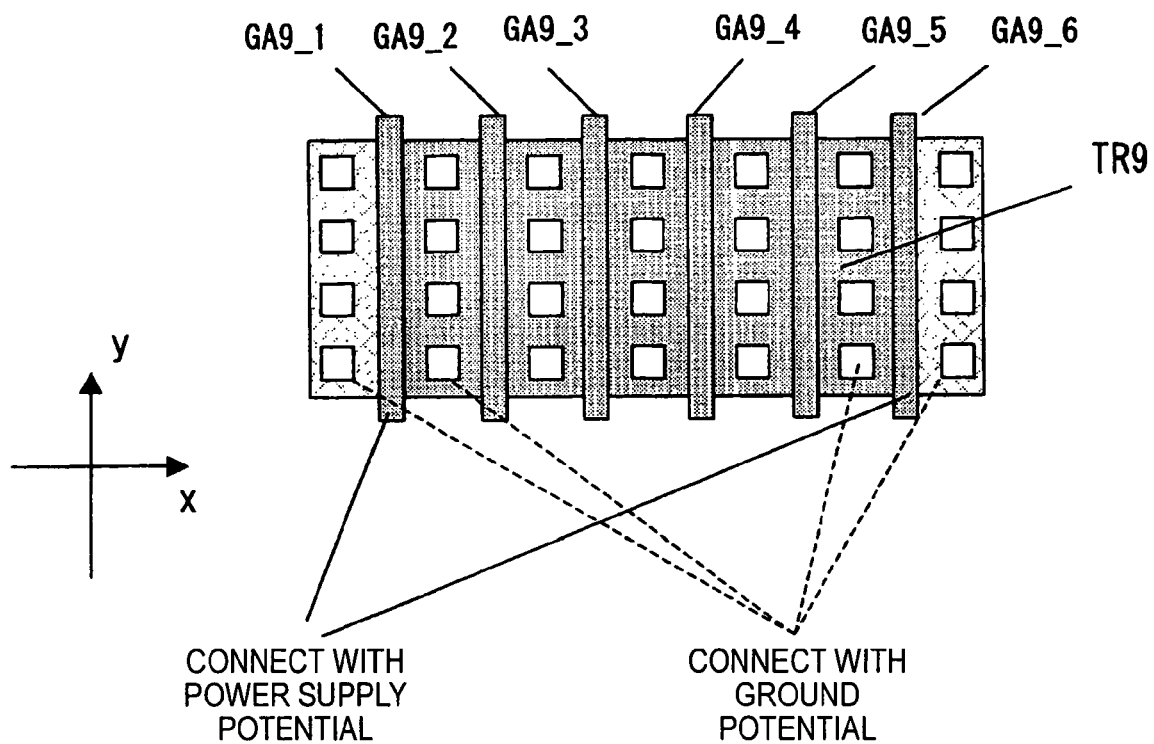
FIG. 32 is a layout of a semiconductor device designed by a layout design method in a fourth embodiment.

FIG. 32 is a diagram showing a layout according to a fourth embodiment of the invention. TR9 is an N channel transistor formed on a PWELL having gate electrodes GA9_1 to 6. Here, GA9_1 and GA9_6 among the gate electrodes are fixed to a power supply potential and active regions indicated by shade and active regions adjacent to the gate electrodes GA9_1 and GA9_6 are connected to a ground potential. Thus, the regions substantially work as capacitive components of the power supply potential and the ground potential. Since the gate electrodes GA9_1 to GA9_6 are arranged such that gate patterns are arranged uniformly with the gate electrodes GA9_2 to 5, which operate dynamically, in a gate length direction (an x direction in the figure) with the GA9_1 and GA9_6 at both ends, it is possible to control fluctuation in the gate electrodes GA9_2 to GA9_5 affecting an actual circuit operation to be small. In addition, since an active region, which actually operates, is also surrounded by the active regions indicated by shade, which work as capacitors, it is possible to control decline in ability due to fluctuation and stress.

In this way, according to the layout design method in the fourth embodiment of the invention, additional gate patterns are provided on active region and connected to a power supply potential and active regions, which does not perform a dynamic operation, are provided at both ends of the transistor. Thus, although an area increases, it is possible to control fluctuation in shapes of gate electrodes of the transistor and fluctuation in a current ability of the transistor. In addition, since gate patterns at both ends are present on active regions in the gate length direction and fixed to the power supply potential and active regions adjacent to the active regions are fixed to the ground potential, there is an effect that the active regions work as capacitive components for fixing a power supply.

Note that, in this embodiment, in the N channel transistor created in the PWELL region, the gate electrodes are fixed to the power supply potential and the active regions at both the ends are fixed to the ground potential. However, it is needless to mention that potentials connected to formed regions, gate electrodes, and active regions may be different.

The semiconductor device and the layout design method according to the invention is advantageous for a reduction in a design man-hour and a reduction in an area in a semiconductor device in which additional gate patterns are arranged as dummy gate to control fluctuation in gate electrodes.

What is claimed is:

1. A semiconductor device, comprising:
   a first transistor comprising a plurality of gate electrodes
   first and second dummy gate patterns, each formed in parallel with and at a fixed distance from a gate electrode of the first transistor and on the same layer as the gate electrodes; and
   wherein the first dummy gate pattern and the second dummy gate pattern are arranged to have a different length in a direction perpendicular to a channel of the first transistor;
   the first and second dummy gate patterns are arranged at both ends in a gate length direction of the first transistor, and are arranged in an shape identical with that of the gate electrodes; and
   a first gate electrode arranged on an active region of the first transistor is extended to the outside of the active region in a gate width direction so that the first electrode is arranged over at least both ends of the active region of a second gate electrode in the gate width direction.

2. The semiconductor device according to claim 1, wherein the first dummy gate pattern is electrically connected to a gate electrode included in the first transistor by a third dummy gate pattern.

3. The semiconductor device according to claim 1, wherein the first dummy gate pattern is connected to a potential different from a power supply potential and a ground potential.

4. The semiconductor device according to claim 1, wherein the second dummy gate pattern is always floating electrically.

5. The semiconductor device according to claim 1, wherein the second dummy gate pattern is connected to a power supply potential or a ground potential.

6. The semiconductor device according to claim 1, wherein the first dummy gate pattern has a smaller area than the second dummy gate pattern.

7. The semiconductor device according to claim 1, wherein the first dummy gate pattern is formed on an inactive region.

8. The semiconductor device according to claim 1, wherein a contact for connecting with a metal wiring layer is arranged on the first dummy gate pattern.

9. The semiconductor device according to claim 8, wherein at least two or more contacts are arranged in parallel with the gate electrode of the first transistor at a fixed interval.

10. The semiconductor device according to claim 1, wherein the first dummy gate pattern has a shape identical to a shape of the gate electrode of the first transistor or a shape including the gate electrode and a projected part thereof to an active region of the gate electrode.

11. The semiconductor device according to claim 1, wherein the first dummy gate pattern and the second dummy gate pattern are arranged at fixed distance from the first and the second gate electrodes arranged at both ends in a gate length direction in the active region of the first transistor, respectively, the first dummy gate pattern is arranged over both ends in a gate width direction of a first gate electrode and the second dummy gate pattern is arranged over both ends in a gate width direction of the second gate electrode.

12. The semiconductor device according to claim 1, wherein a contact for connecting with a metal wiring layer is arranged in a position to which the first gate electrode is extended to the outside of the active region.

13. A layout method for producing a semiconductor device according to claim 1, comprising:
   a transistor forming step of arranging a transistor having one or plural gate electrodes; and
   a dummy gate forming step of forming first and second gate patterns that are formed in parallel with and at a fixed distance from the gate electrodes of the transistor and in a same layer as that for the gate electrodes and has a composition identical with that of the gate electrodes;
   wherein the first and the second dummy gate patterns are formed to be allowed to be asymmetrical to the gate electrodes.

14. The layout design method according to claim 13, wherein the first and the second dummy gate patterns are formed in different regions in a gate width direction of the transistor.

15. The layout design method according to claim 13, wherein the transistor forming step or the dummy gate pattern forming step includes the steps of:
   extending a first gate electrode included in the transistor to the outside of an active region, at least to a region over both ends in a gate width direction on an active region of an adjacent second gate electrode arranged on the identical active region of the transistor.

16. The semiconductor device according to claim 1,
   wherein the first dummy gate pattern and the gate electrode of the first transistor are electrically connected to a common contact pattern.

17. The semiconductor device according to claim 16,
   wherein the edge of the contact pattern is aligned along the edge of the wiring pattern connecting the gate electrode to the contact pattern.

18. The semiconductor device according to claim 16,
   wherein the contact pattern forms a double via.

* * * * *